(12) United States Patent
Kinoshita

(10) Patent No.: US 8,372,490 B2
(45) Date of Patent: Feb. 12, 2013

(54) FILM-FORMATION METHOD, METHOD FOR MANUFACTURING ELECTRO-OPTICAL DEVICE, ELECTRO-OPTICAL DEVICE, AND ELECTRONIC APPARATUS

(75) Inventor: Toyotaro Kinoshita, Osaka (JP)

(73) Assignee: Seiko Epson Corporation, Tokyo (JP)

( * ) Notice: Subject to any disclaimer, the term of this patent is extended or adjusted under 35 U.S.C. 154(b) by 534 days.

(21) Appl. No.: 12/552,577

(22) Filed: Sep. 2, 2009

(65) Prior Publication Data

US 2010/0062147 A1    Mar. 11, 2010

(30) Foreign Application Priority Data

Sep. 8, 2008  (JP) ................................. 2008-229469

(51) Int. Cl.
*B05D 3/00*    (2006.01)
(52) U.S. Cl. ........ 427/532; 427/510; 427/551; 427/552; 427/553; 427/557
(58) Field of Classification Search .................. 427/510, 427/532, 551–553, 557
See application file for complete search history.

(56) References Cited

U.S. PATENT DOCUMENTS

| 6,450,635 B1 * | 9/2002 | Okabe et al. .................. 347/106 |
| 6,815,125 B1 * | 11/2004 | Okabe et al. ...................... 430/7 |
| 2005/0042385 A1 * | 2/2005 | Okabe et al. .................. 427/466 |

FOREIGN PATENT DOCUMENTS

| JP | 10-142418 | * | 5/1998 |
| JP | 2001-272527 A | | 10/2001 |
| JP | 2004-198540 A | | 7/2004 |
| JP | 2007-47441 A | | 2/2007 |

* cited by examiner

*Primary Examiner* — Robert S Walters, Jr.
(74) *Attorney, Agent, or Firm* — Global IP Counselors, LLP

(57) ABSTRACT

A film-formation method is a method for depositing a liquid containing a film material to form a film in a prescribed film formation area enclosed by a partition wall on a substrate. The film-formation method includes forming the partition wall using at least in part a wettability-variable material in which wettability with respect to the liquid is variable, depositing the liquid in the film formation area, varying the wettability of the wettability-variable material in the partition wall in a state in which the liquid is disposed within the film formation area so that liquid affinity of the wettability-variable material becomes higher than liquid affinity of the wettability-variable material before the liquid is deposited in the film formation area, and forming the film by solidifying the film material in the liquid.

11 Claims, 20 Drawing Sheets

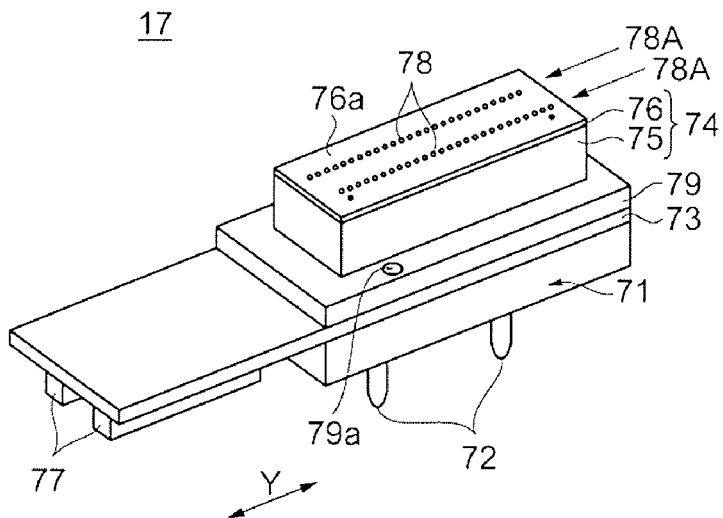
F I G. 2A
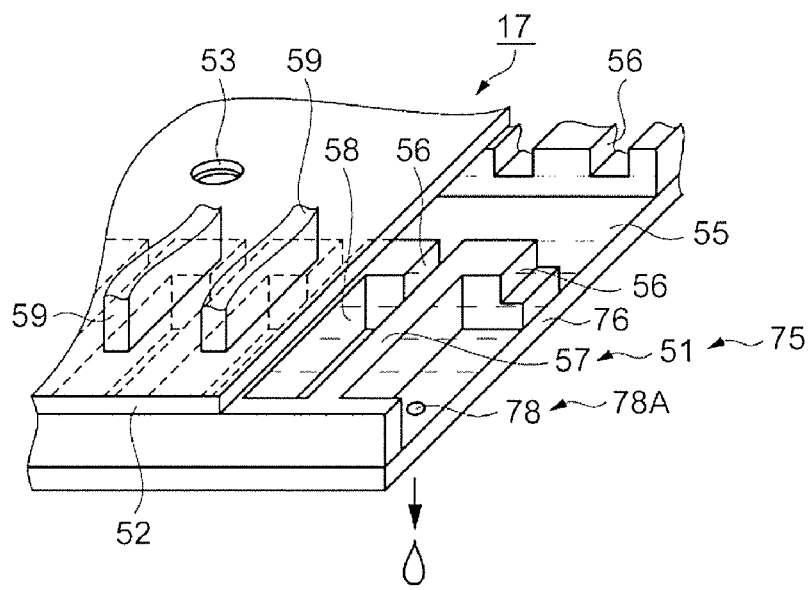
F I G. 2B
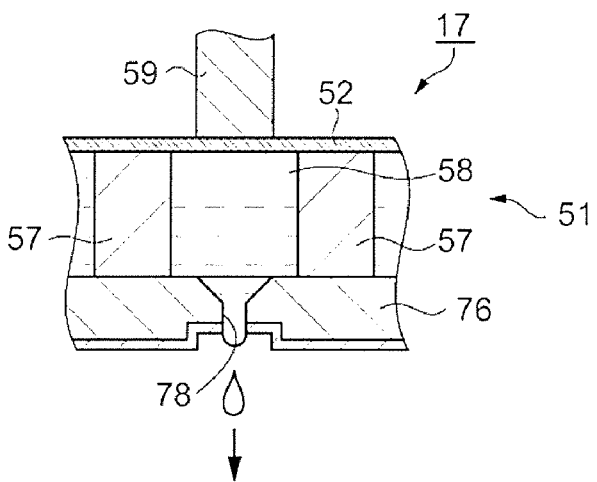
F I G. 2C

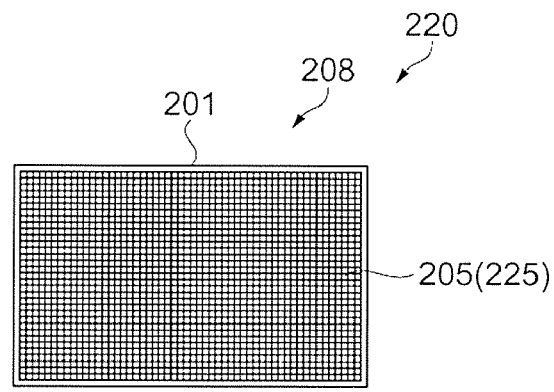
F I G. 4A
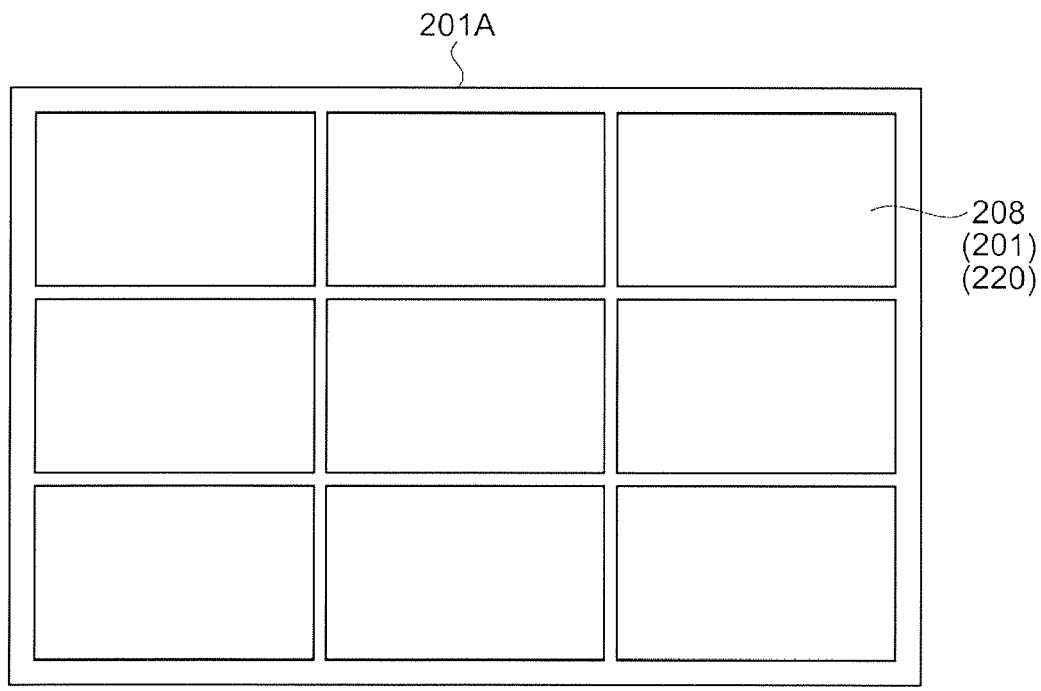
F I G. 4B

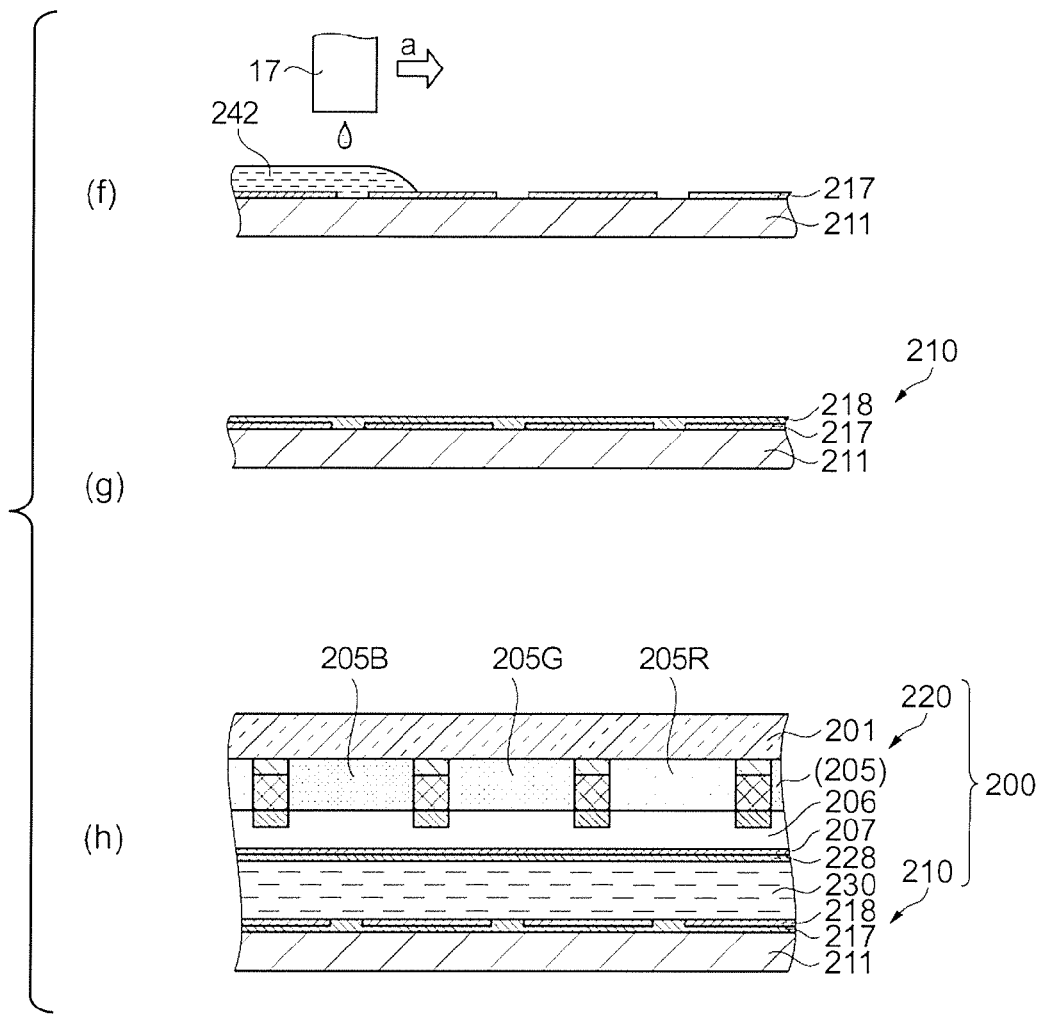
F I G. 10

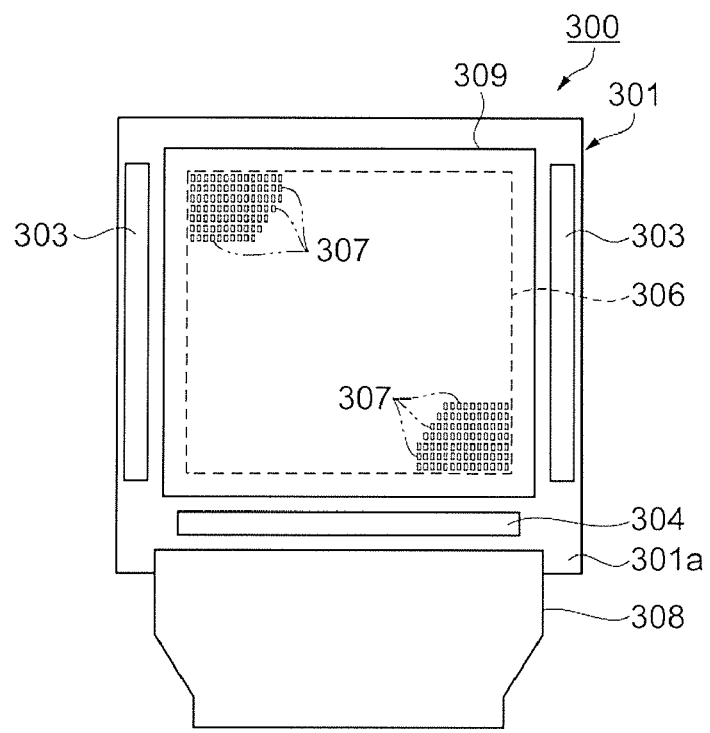
F I G. 11
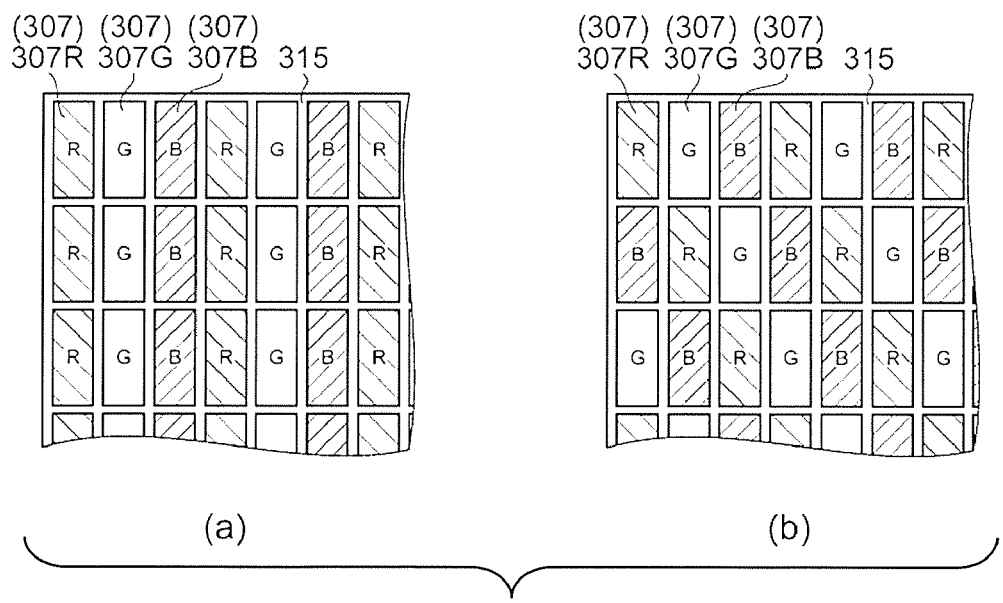
F I G. 12

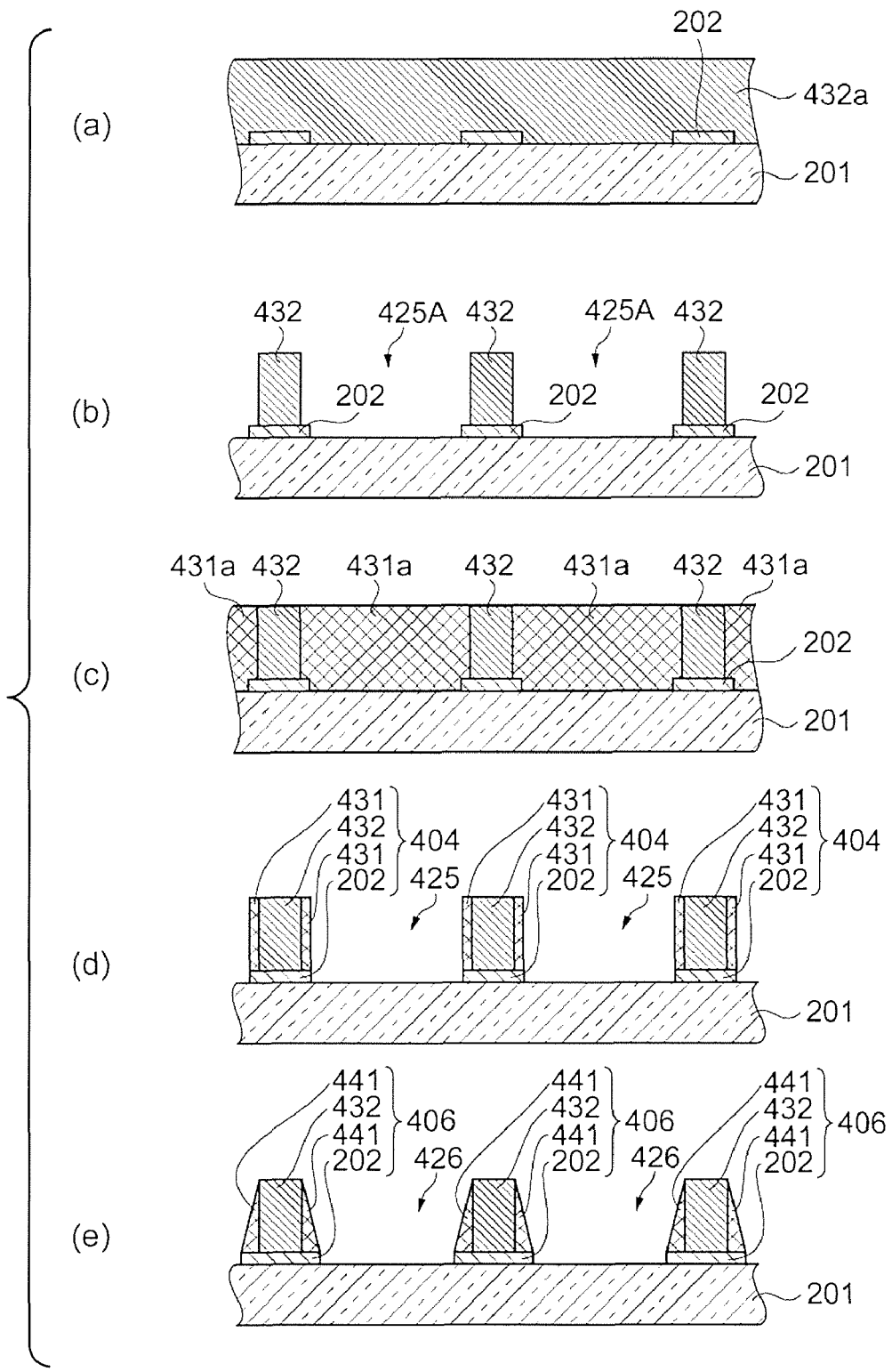
F I G. 17

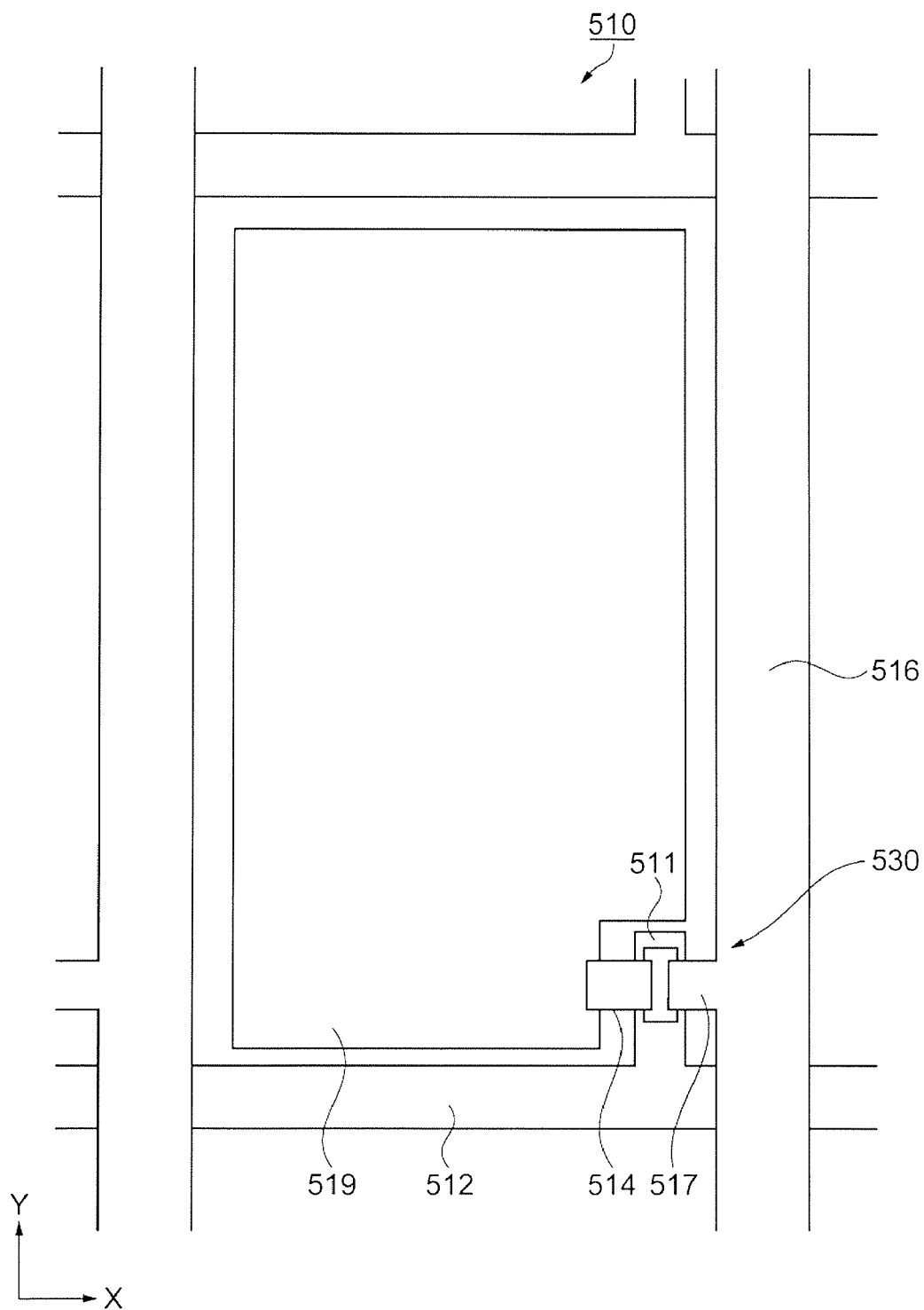
F I G. 19

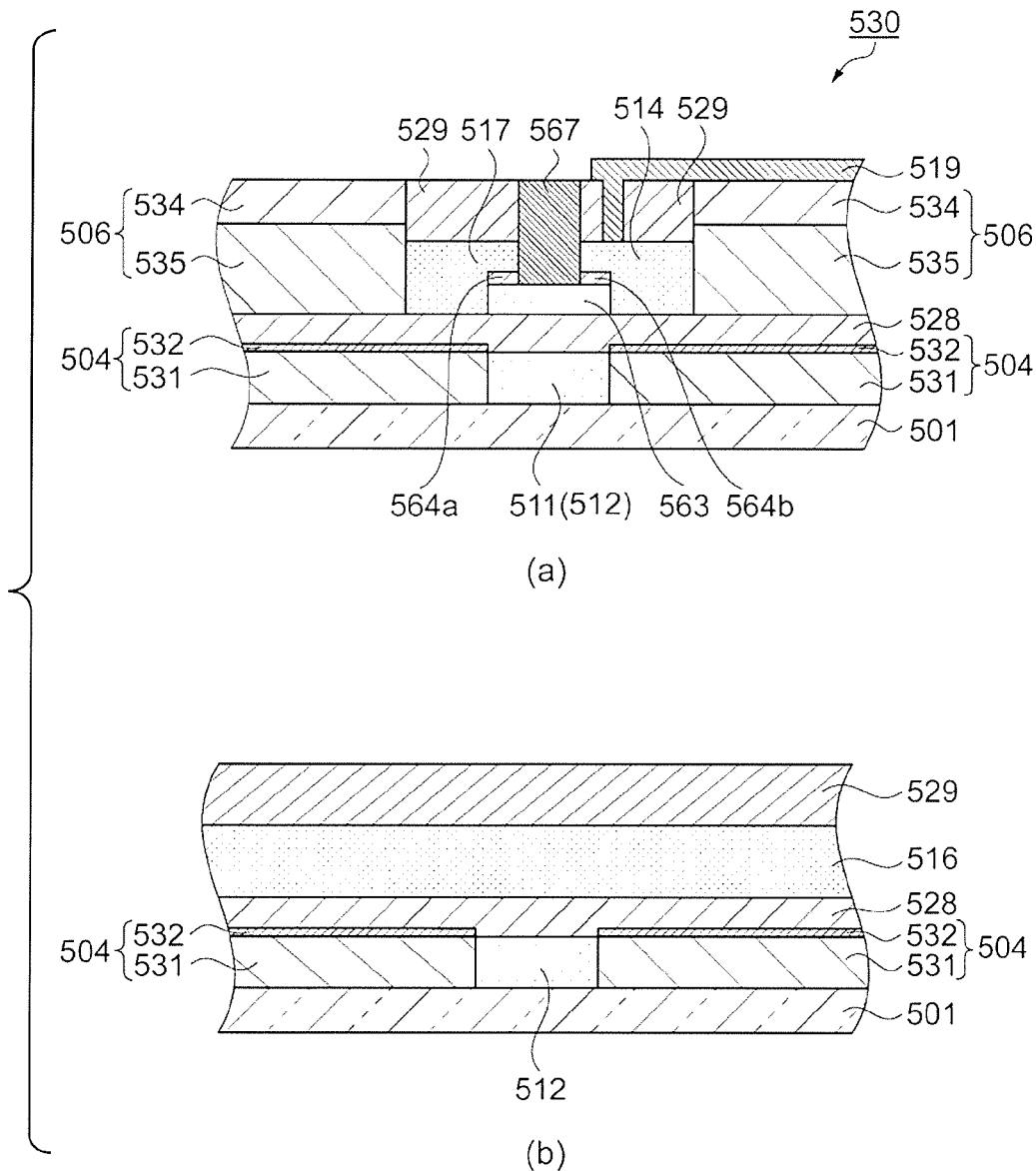
F I G. 20

FILM-FORMATION METHOD, METHOD FOR MANUFACTURING ELECTRO-OPTICAL DEVICE, ELECTRO-OPTICAL DEVICE, AND ELECTRONIC APPARATUS

CROSS-REFERENCE TO RELATED APPLICATIONS

This application claims priority to Japanese Patent Application No. 2008-229469 filed on Sep. 8, 2008. The entire disclosure of Japanese Patent Application No. 2008-229469 is hereby incorporated herein by reference.

BACKGROUND

1. Technical Field

The present invention relates to a film-formation method for depositing a film formation material in a film formation region to form a film in the film formation region, a method for manufacturing electro-optical device using the film-formation method, an electro-optical device provided with the film, and an electronic apparatus provided with the electro-optical device.

2. Related Art

There are known conventional techniques for forming a color filter film or another functional film of a color liquid crystal device as an example of an electro-optical device in which droplets of a liquid containing a material of a functional film are discharged and made to land in arbitrary positions on the substrate using a drawing device having a droplet discharge head for discharging liquid as droplets, whereby liquid is deposited (drawn) in the positions and the deposited liquid is dried to form a functional film.

There is a need to obtain a specified film shape and thickness in order to achieve advantageous function in a functional film. An accurate film shape is achieved by specifying the shape of the functional liquid and the region in which the functional liquid spreads by forming partition walls that enclose a partition in which the functional film in is formed on a substrate.

A color filter and a method for manufacturing the same is disclosed Japanese Laid-Open Patent Application No. 2001-272527 in which a liquid-repellent section if provided as a partition wall. According to the color filter and the method for manufacturing same, a pixel section formation ink deposited in a pixel section that has been partitioned by the liquid-repellent section does not pass over the liquid-repellent section and enter into adjacent pixel sections. It is therefore possible to reduce the chance that the color of the filter film will be compromised due to the pixel section formation ink mixing together.

However, since the entire partition wall is liquid repellent, there is a problem in that it is difficult to fill the ink around the edges of the partition wall because the pixel section formation ink is repelled from the side surface of the partition wall. Difficulty in filling the ink around the edges of the partition wall results in a situation in which it is less likely that an accurate external shape will be achieved in which the planar shape of the film is formed by the partition wall, and the film thickness is more likely to be reduced at the external peripheral portion near the partition wall. The planar shape and cross-sectional shape of the filter film is thereby compromised and the possibility that suitable function cannot be achieved is increased.

Disclosed in Japanese Laid-Open Patent Application No. 2007-47441 is a method for manufacturing a color filter, as well as a liquid crystal device and an electronic apparatus in which the liquid repellency of the upper surface of the bank (partition walls) is maintained and the side surface is made liquid affinity property, whereby functional liquid is also uniformly filled in at the edges of the back apertures (partitions formed by the functional film), and a filter film having a suitable planar shape and a uniform thickness can be formed.

SUMMARY

However, the method disclosed in Japanese Laid-Open Patent Application No. 2007-47441 has a problem in that the functional liquid that has landed sufficiently acclimates to the side surface. Therefore, the functional liquid that has landed so as to ride up onto the top in continuous fashion from the side surface is deposited, albeit slightly, on the top without being repelled so as to slip down from the top. Similarly, there is a possibility that the functional liquid deposited in excess of the volume of the bank aperture (partition for forming the functional film) will extend as far as the top section.

In an electro-optical device having a color filter or another functional film and used for emitting light and transmitting light from the film, there is a trend toward narrowing the partition walls that separate the space between the films in order to improve the aperture ratio of the transmitting section of the light or luminescence. There is a possibility that a portion of the film will bond together between the partitions for forming a functional film when the functional liquid is deposited on the narrow top section.

The present invention was contrived in order to solve at least a portion of the problems described above, and can be implemented in the following modes and application examples.

A film-formation method according to a first aspect is a method for depositing a liquid containing a film material to form a film in a prescribed film formation area enclosed by a partition wall on a substrate. The film-formation method includes forming the partition wall using at least in part a wettability-variable material in which wettability with respect to the liquid is variable, depositing the liquid in the film formation area, varying the wettability of the wettability-variable material in the partition wall in a state in which the liquid is disposed within the film formation area so that liquid affinity of the wettability-variable material becomes higher than liquid affinity of the wettability-variable material before the liquid is deposited in the film formation area, and forming the film by solidifying the film material in the liquid.

According to this film-formation method, at least a portion of the partition wall that specifies a film formation partition is formed using a wettability-variable material in which the wettability in relation to the liquid can be varied. A liquid is deposited in the film formation partition. The wettability-variable material portion of the partition wall is more readily wetted by the liquid by making the wettability-variable material with liquid affinity in a state in which the liquid has been deposited in the film formation partition. Therefore, the liquid deposited in the film formation partition wets and spreads to the side surface of the partition wall and more readily wets and spreads over the entire area of the film formation partition. The film can thereby be formed without gaps over the entire surface of the film formation partition.

In the film-formation method as described above, the forming of the partition wall preferably includes forming at least a portion of an upper surface of the partition wall using a material having liquid-repelling properties with respect to the liquid.

According to this film-formation method, at least a portion of the upper surface of the partition wall has liquid-repellency with respect to the liquid. Since the liquid is deposited in the film formation partition, it is highly likely that liquid that has ridden up onto the partition wall will be repelled by the liquid-repellent upper surface and flow down into the film formation partition, and that the liquid can be prevented from remaining on the partition wall.

In the film-formation method as described above, the forming of the partition wall preferably includes layering one or more partition wall layers including a partition wall layer composed of the wettability-variable material to form the partition wall.

According to this film-formation method, at least a portion of the sidewall of the partition wall can be made into a surface in which the wettability with respect to the liquid can be varied because the partition wall includes a partition wall layer composed of a wettability-variable material.

In the film-formation method as described above, the forming of the partition wall preferably further includes forming a first partition wall layer composed of a first wettability-variable material, and forming a second partition wall layer composed of a second wettability-variable material in which wettability is variable by a method different from a method of varying wettability of the first wettability-variable material.

According to this film-formation method, one among the first partition wall layer and the second partition wall layer can be kept liquid repellent while the other can be made liquid affinity property because the method for varying the wettability is different for the first wettability-variable material and the second wettability-variable material. The operation for depositing the liquid in a state in which the sidewall of the partition wall is liquid repellent, making the sidewall of the partition wall to be made liquid affinity property, and causing the liquid to wet and spread to the edge of the partition wall can thereby be carried out in a plurality of cycles.

In the film-formation method as described above, the forming of the partition wall preferably further includes forming a first partition wall film, removing a portion of the first partition wall film to form an enlarged partitioned area having a size that includes the film formation area, forming a second partition wall film composed of the wettability-variable material in the enlarged partitioned area, and removing a portion of the second partition wall film to form the film formation area.

According to this film-formation method, the surface of the partition wall facing the film formation partition can be formed using a wettability-variable material because a portion of the second partition wall film composed of a wettability-variable material is removed to form the film formation partition. Since at least a portion of the top section of the partition wall is formed using a first partition wall film, at least a portion of the top section of the partition wall can be made liquid repellent by forming the first partition wall film using a material that has liquid repellency with respect to the liquid.

In the film-formation method as described above, the varying of the wettability of the wettability-variable material preferably includes varying the wettability by applying heat to the wettability-variable material.

According to this film-formation method, wettability can be varied without the need of direct contact during treatment because the wettability can be varied by applying heat. Also, wettability can be varied at different times for each material by forming the partition wall using a plurality of materials having mutually different temperatures at which wettability varies.

In the film-formation method as described above, the varying of the wettability of the wettability-variable material preferably includes varying the wettability by irradiating the wettability-variable material with light.

According to this film-formation method, wettability can be varied by irradiating light. Therefore, light can be irradiated in only the portions for which wettability is to be varied when a treatment is to be carried out for varying the wettability. Accordingly, it is possible to vary only the portions for which the wettability variation is desired, and other portions can be left unaffected.

In the film-formation method as described above, the forming of the film preferably includes solidifying the film material by applying heat to the liquid.

According to this film-formation method, heat is applied to the liquid in order to solidify the film material. When the wettability-variable material is a material in which the wettability is varied by applying heat, the wettability variation step for varying the wettability of the wettability-variable material and the film formation step for solidifying the film material to form a film can be carried out in a single operation of applying heat.

In the film-formation method as described above, the forming of the film preferably includes solidifying the film material by irradiating the liquid with light.

According to this film-formation method, the liquid is irradiated with light in order to solidify the film material. When the material is to be made liquid affinity property by irradiating the wettability-variable material with light, the wettability variation step for varying the wettability of the wettability-variable material and the film formation step for solidifying the film material to form a film can be carried out in the same step using the same light-irradiation device.

A method for manufacturing an electro-optical device according to a second aspect includes forming a functional film constituting an electro-conductive device using the film-formation method as described above.

According to this method for manufacturing an electro-optical device, a functional film is formed using a film-formation method in which the wetting and spreading of the liquid containing a film material over the entire surface of the film formation partition is facilitated prior to solidifying the film material deposited in the film formation partition. Accordingly, it is possible to accurately form the shape of the functional liquid and to manufacture an electro-optical device having a highly sophisticated functional film in which designed functions are implemented.

An electro-optical device according to a third aspect includes a functional film formed by using the film-formation method as described above.

According to this electro-optical device, a functional film provided to an electro-optical device is formed using a film-formation method in which the wetting and spreading of the liquid containing a film material over the entire surface of the film formation partition is facilitated prior to solidifying the film material deposited in the film formation partition. Accordingly, the shape of the functional film is accurately formed, making it possible to sufficiently implement functions that are affected by film shape and to achieve an electro-optical device having a highly sophisticated functional film in which designed functions are implemented.

An electronic apparatus according to a fourth aspect includes the electro-optical device as described above.

According to this electronic apparatus, the shape of the functional film is accurately formed and an electro-optical device having a highly sophisticated functional film for implementing designed functions is provided. Accordingly, it is possible to achieve a highly sophisticated electronic device in which designed functions are implemented.

BRIEF DESCRIPTION OF THE DRAWINGS

Referring now to the attached drawings which form a part of this original disclosure:

FIG. 2A is a perspective view of the external appearance of the droplet discharge head as viewed from the nozzle plate side;

FIG. 2B is a perspective cross-sectional view showing the structure around the pressure chamber of the droplet discharge head;

FIG. 2C is a cross-sectional view showing the structure of the discharge nozzle section of the droplet discharge head;

FIG. 4A is a plan view schematically showing the planar structure of an opposing substrate, and FIG. 4B is a plan view schematically showing the planar structure of a mother opposing substrate;

FIG. 10 is a cross-sectional view showing the steps or the like for forming an element substrate in the process for forming a liquid crystal display panel;

FIG. 11 is a schematic front view showing the plan configuration of the organic EL display device;

FIG. 12 is a plan view showing the arrangement example of the organic EL display device;

FIG. 17 is a cross-sectional view showing the process for configuring the partition walls;

FIG. 19 is a plan view showing the schematic configuration of a portion containing a single TFT on a TFT array substrate;

FIG. 20(*a*) is a cross-sectional view of a portion containing a TFT, and FIG. 20(*b*) is a cross-sectional view of a portion in which the gate lines and the source lines intersect in a planar fashion;

DETAILED DESCRIPTION OF EXEMPLARY EMBODIMENTS

Figure 1:
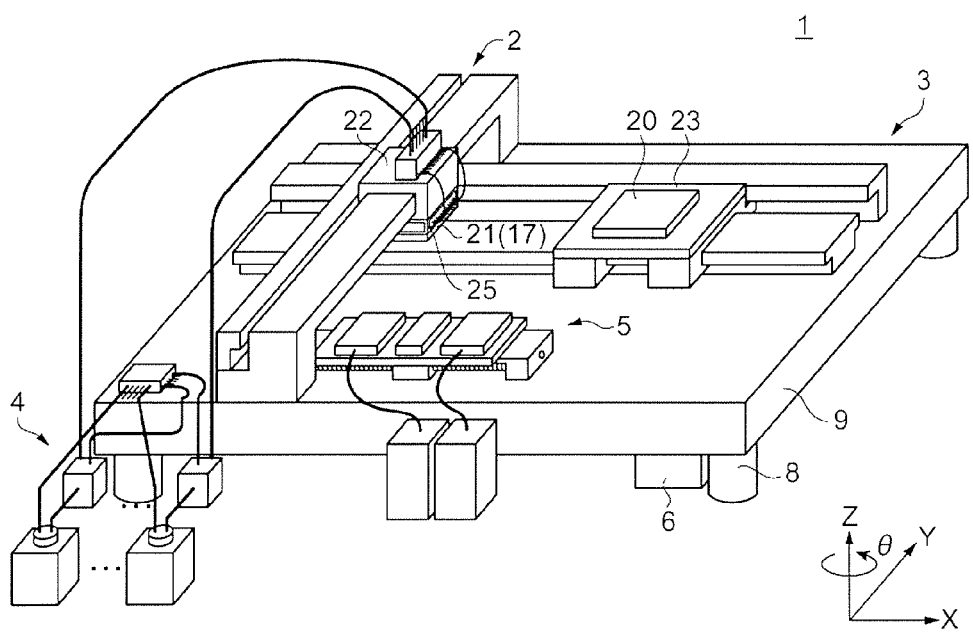
FIG. 1 is a perspective view of the external appearance showing the general configuration of the droplet discharge device.

Preferred embodiments of the film-formation method, method for manufacturing an electro-optical device, electro-optical device, and electronic apparatus are described below with reference to the accompanying drawings. The embodiments will be described using as an example a method for manufacturing a color filter film and a luminescent layer or another functional film in a step for manufacturing a color filter substrate of a liquid crystal display panel constituting a liquid crystal device as an example of an electro-optical device, and a step for manufacturing an organic EL display device as an example of an electro-optical device. In the step for manufacturing the functional film, an example will be described using a method for depositing a functional liquid containing a functional film material in predetermined partitions on a substrate using a droplet discharge device having an inkjet-type droplet discharge head as an example of a discharge head. For the sake of convenience in the drawings referred to in the description below, there are cases in which the lengthwise and crosswise scaling of members or portions are different from actual members or portions.

First Embodiment

Described first is a first embodiment as an embodiment of the film-formation method, method for manufacturing an electro-optical device, electro-optical device, and electronic apparatus. The present embodiment will be described using a film-formation method as an example in which a step is used for forming a color element film (filter film), which is an example of a functional film, in the step for manufacturing a color filter of a liquid crystal display device, which is an example of an electro-optical device.

The droplet discharge method used in the formation of a filter film or another functional film will be described first. The droplet discharge method has an advantage in that a desired amount of material can be deposited with good accuracy in a desired position without wasteful usage of the material. Examples of the discharge technique of the droplet discharge method include an electrification control scheme, a pressurized vibration scheme, an electromechanical conversion scheme, an electrothermal conversion scheme, and an electrostatic attraction scheme.

Among these, an electromechanical conversion scheme makes use of the property in which a piezoelement (piezoelectric element) receives a pulse-like electric signal and deforms. The deformation of the piezoelement applies pressure via a member formed from a material having flexibility in a space in which the liquid material is stored, liquid material is pushed from the space and discharged from the discharge nozzle. The piezo scheme does not heat the liquid material and therefore has an advantage in that the size of the droplets can be readily adjusted by adjusting the drive voltage and the composition or the like of the material is not affected. In the present embodiment, since the composition or the like of the material is not affected, the degree of freedom in selecting the liquid material is high and the size of the droplets can be readily adjusted. Therefore, the piezo scheme is used because the controllability of the droplets is good.

Droplet Discharge Device

Next, the overall configuration of the droplet discharge device 1 for depositing functional liquid and provided with a droplet discharge head 17 will be described with reference to FIG. 1. FIG. 1 is a perspective view of the external appearance showing the general configuration of the droplet discharge device.

The droplet discharge device 1 is provided with a head mechanism section 2, a workpiece mechanism section 3, a functional liquid feed section 4, and a maintenance device section 5, as shown in FIG. 1. The head mechanism section 2 has a droplet discharge head 17 for discharging as droplets a functional liquid acting as the liquid. The workpiece mechanism section 3 has a workpiece stage 23 for mounting a workpiece 20 as the discharge target of the droplets discharged from the droplet discharge head 17. The functional liquid feed section 4 has a relay tank and liquid feed tube. The liquid feed tube is connected to the droplet discharge head 17, and functional liquid is fed to the droplet discharge head 17 via the liquid feed tube. The maintenance device section 5 is provided with devices for carrying out inspection and maintenance of the droplet discharge head 17. The droplet discharge device 1 is provided with a discharge device control section 6 for providing overall control of these mechanisms and the like.

The droplet discharge device 1 is provided with a plurality of support legs 8 disposed on the floor, and a surface plate 9 disposed on the obverse side of the support legs 8. The workpiece mechanism section 3 is disposed on the obverse side of the surface plate 9 so as to extend in the lengthwise direction (X-axis direction) of the surface plate 9. The head mechanism section 2 supported by two support columns secured to the surface plate 9 is disposed above the workpiece mechanism section 3 so as to extend in the direction orthogonal (Y-axis direction) to the workpiece mechanism section 3. A functional liquid tank or the like of the functional liquid feed section 4, which has a feed tube that is in communication with the droplet discharge head 17 of the head mechanism section 2, is disposed to the side of the surface plate 9. The maintenance device section 5 is disposed in the vicinity of one of the support columns of the head mechanism section 2 in the X-axis direction in alignment with the workpiece mechanism section 3. The discharge device control section 6 is furthermore accommodated below the surface plate 9.

The head mechanism section 2 is provided with a head unit 21 having the droplet discharge head 17, a head carriage 25 having the head unit 21, and a movement frame 22 from which the head carriage 25 is suspended. The droplet discharge head 17 is freely moved in the Y-axis direction by moving the movement frame 22 in the Y-axis direction using a Y-axis table, and is held in the moved position. The workpiece mechanism section 3 freely moves the workpiece stage 23 in the X-axis direction using an X-axis table, whereby the workpiece 20 mounted on the workpiece stage 23 is moved in the X-axis direction, and is held in the moved position.

In this manner, the droplet discharge head 17 moves to the discharge position in the Y-axis direction and stops, and the functional liquid is discharged as droplets in synchronization with the movement of the workpiece 20 below in the X-axis direction. Droplets can be made to land in any position on the workpiece 20 by controlling the relative movement of the workpiece 20 that moves in the X-axis direction and the droplet discharge head 17 that moves in the Y-axis direction, whereby desired plane-shaped drawing can be carried out.

Droplet Discharge Head

Next, the droplet discharge head 17 will be described with reference to FIGS. 2A to 2C. FIGS. 2A to 2C are views showing the configuration of the droplet discharge head. FIG. 2A is a perspective view of the external appearance of the droplet discharge head as viewed from the nozzle plate side, FIG. 2B is a perspective cross-sectional view showing the structure around the pressure chamber of the droplet discharge head, and FIG. 2C is a cross-sectional view showing the structure of the discharge nozzle section of the droplet discharge head. The droplet discharge head 17 corresponds to discharge means.

The droplet discharge head 17 is a so-called two-row head, and is provided with a liquid introduction section 71 having two connection needles 72, 72, as well as a head substrate 73 extended lateral to the liquid introduction section 71, a pump section 75 extending to the liquid introduction section 71, and a nozzle plate 76 extending to the pump section 75, as shown in FIG. 2A. A tube connection member is connected to each of the connection needles 72 of the liquid introduction section 71, the liquid feed tube is connected via the tube connection member, and functional liquid is fed from the functional liquid feed section 4 connected to the liquid feed tube. A pair of head connectors 77, 77 is mounted on the head substrate 73, and a flexible flat cable (FFC cable) is connected via the head connector 77. The droplet discharge head 17 is connected to the discharge device control section 6 via the FFC cable, and signals are transceived via the FFC cable. A substantially quadrangular head main body 74 is composed of the pump section 75 and the nozzle plate 76.

The base section side of the pump section 75, i.e., the base section side of the head main body 74 has a flange section 79 formed in the shape of a quadrangular flange for seating the liquid introduction section 71 and the head substrate 73. A pair of screw holes (female thread) 79a for small screws for securing the droplet discharge head 17 is formed in the flange section 79. The droplet discharge head 17 is secured to a head-holding member by head setscrews threaded into the screw holes 79a through the head-holding member.

There are two nozzle rows 78A formed on a nozzle formation surface 76a of the nozzle plate 76. The nozzle rows 78A are formed on the nozzle plate 76 and are composed of discharge nozzles 78 for discharging liquid. The two nozzle rows 78A are arranged parallel to each other, each of the nozzle rows 78A composed of, e.g., 180 (shown schematically in the drawings) discharge nozzles 78 aligned at an equal pitch. In other words, two nozzle rows 78A are arranged on the two sides of the centerline in the nozzle formation surface 76a of the head main body 74.

The nozzle rows 78A extend in the Y-axis direction when the droplet discharge head 17 has been mounted on the droplet discharge device 1. The discharge nozzles 78 constituting the two nozzle rows 78A are positionally offset by half a nozzle pitch from each other in the Y-axis direction. A single nozzle pitch is, e.g., 140 μm. Droplets discharged from the discharge nozzles 78 constituting each of the nozzle rows 78A are designed to land in the same position in the X-axis direction in a rectilinear fashion in alignment with the Y-axis direction at equidistance intervals. In the case that the nozzle pitch of the discharge nozzles 78 in the nozzle rows 78A is 140 μm, the center distance of the landing positions extending in the stated rectilinear fashion is designed to be 70 μm.

The droplet discharge head 17 has a pressure chamber plate 51 that constitutes the pump section 75 and is layered on the nozzle plate 76, and has a vibration plate 52 layered on the pressure chamber plate 51, as shown in FIGS. 2B and 2C.

A liquid reservoir 55 constantly filled with functional liquid fed from the liquid introduction section 71 via a liquid feed hole 53 of the vibration plate 52 is formed in the pressure chamber plate 51. The liquid reservoir 55 is a space enclosed by the vibration plate 52, the nozzle plate 76, and the walls of the pressure chamber plate 51. A pressure chamber 58 partitioned by a plurality of head partition walls 57 is formed in the pressure chamber plate 51. The space enclosed by the vibration plate 52, the nozzle plate 76, and two head partition walls 57 is the pressure chamber 58.

The pressure chamber 58 is provided in correspondence with each of the discharge nozzles 78, and the number of pressure chambers 58 and the number of discharge nozzles 78 are the same. Functional liquid from the liquid reservoir 55 is fed to the pressure chamber 58 via a feed port 56 positioned between the two head partition walls 57. Groups comprising the head partition walls 57, the pressures chamber 58, the discharge nozzles 78, and the feed ports 56 are aligned in a single row along the liquid reservoir 55, and the discharge nozzles 78 are aligned in a single row form a nozzle row 78A. Although not shown in FIG. 2B, discharge nozzles 78 arranged in a single row form another nozzle row 78A in a substantially symmetrical position in relation to the liquid reservoir 55, and groups comprising the corresponding head partition walls 57, pressure chambers 58, and feed ports 56 are aligned in a single row with respect to the nozzle rows 78A that include the depicted discharge nozzles 78.

One end of piezoelectric elements 59 is secured to each of the portions constituting the pressure chamber 58 of the vibration plate 52. The other end of the piezoelectric elements 59 is secured to a base (not shown) for supporting the entire droplet discharge head 17 via a fixed plate (not shown).

The piezoelectric elements 59 have active sections obtained by layering an electrode layer and a piezoelectric material, and the active sections contract in the lengthwise direction (the thickness direction of the vibration plate 52 in FIG. 2B or 2C) when a drive voltage is applied to the electrode layer. When the active sections contract, there is received a force that pulls the vibration plate 52 secured to one end of the piezoelectric elements 59 to the opposite side of the pressure chamber 58. The vibration plate 52 is pulled toward the opposite side of the pressure chamber 58, whereby the vibration plate 52 flexes toward the opposite side of the pressure chamber 58. Since the volume of the pressure chamber 58 is thereby increased, the functional liquid is fed from the liquid reservoir 55 to the pressure chamber 58 via the feed port 56. Next, when the drive voltage applied to the electrode layer is discontinued, the active section returns to the original length, whereby the piezoelectric element 59 presses the vibration plate 52. The vibration plate 52 is pressed and made to return to the pressure chamber 58 side. The volume of the pressure chamber 58 thereby rapidly returns to the original state, i.e., the increased volume is reduced. Therefore, pressure is applied to the functional liquid present in the pressure chamber 58, and the functional liquid is discharged as a droplet from the nozzle 78 formed in communication with the pressure chamber 58.

The discharge device control section 6 controls the discharge of functional liquid from the discharge nozzles 78 by controlling the voltage applied to the piezoelectric elements 59, i.e., controlling the drive signals. More specifically, the volume of the droplets discharged from the discharge nozzles 78, the number of droplets discharged per unit of time, and other factors can be varied. Therefore, the distance between the droplets that have landed on the substrate, the amount of functional liquid that has been made to land in a fixed surface area on the substrate, and other factors can be varied. For example, a plurality of droplets can be simultaneously discharged at the pitch interval of the discharge nozzles 78 in a range of the length of the nozzle rows 78A in the direction in which the nozzle rows 78A extend by selectively using the discharge nozzles 78 for discharging droplets from among the plurality of discharge nozzles 78 aligned in the nozzle rows 78A. In the direction substantially orthogonal to the direction in which the nozzle rows 78A extend, the substrate and the discharge nozzles 78 are moved in a relative fashion and droplets discharged from the discharge nozzles 78 can be deposited in any position in the directions of relative movement on the substrate that the discharge nozzles 78 are capable of facing. The volume of the droplets discharged from the discharge nozzles 78 is variable between, e.g., 1 pL to 300 pL (picoliter).

Configuration of Liquid Crystal Display Panel

Next, a liquid crystal display panel will be described as an example of a target object for forming a functional film using the droplet discharge device 1. The liquid crystal display panel 200 (see FIG. 3) is an example of a liquid crystal device as an electro-optical device, and is a liquid crystal display panel provided with a color filter for a liquid crystal display panel, which is an example of a color filter as a functional film.

Figure 3:
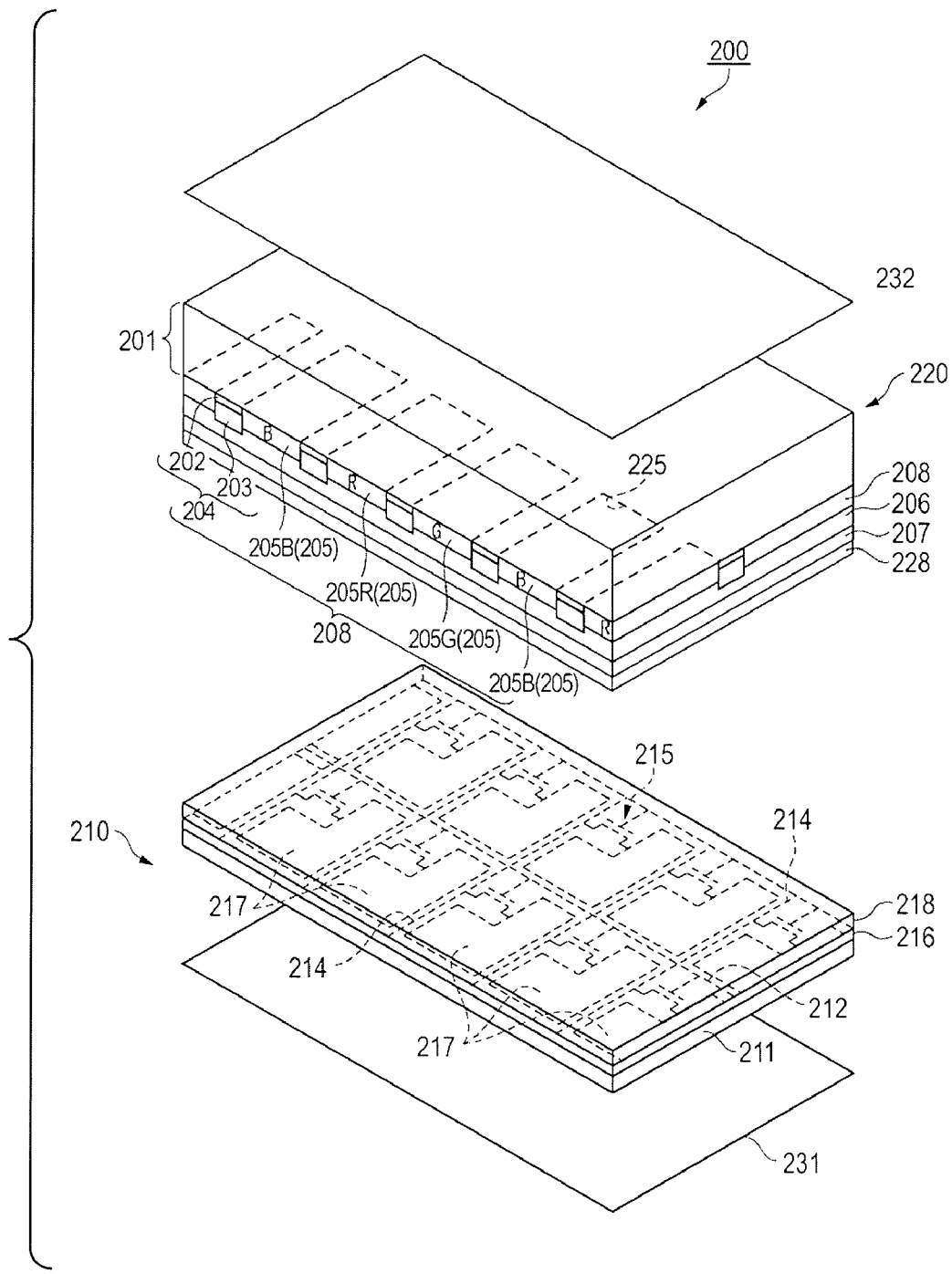
FIG. 3 is an exploded perspective view showing the general configuration of the liquid crystal display panel.

First, the configuration of the liquid crystal display panel 200 will be described with reference to FIG. 3. FIG. 3 is an exploded perspective view showing the general configuration of a liquid crystal display panel. The liquid crystal display panel 200 shown in FIG. 3 is an active matrix-type liquid crystal device that uses thin film transistors (TFT) as the drive elements, and is a transmissive liquid crystal device that uses a backlight (not shown).

The liquid crystal display panel 200 is provided with an element substrate 210 having TFT elements 215, an opposing substrate 220 having opposing electrodes 207, and liquid crystal 230 (see FIG. 10(h)) filled between the opposing substrate 220 and the element substrate 210 bonded by a seal material (not shown), as shown in FIG. 3. A polarizing plate 231 and a polarizing plate 232 are disposed on the affixed element substrate 210 and opposing substrate 220, respectively, on the surfaces of the sides opposite from the mutually affixed surfaces.

The element substrate 210 has the TFT elements 215, electroconductive pixel electrodes 217, scan lines 212, and signal lines 214 formed on the surface that faces the opposing substrate 220 of a glass substrate 211. An insulating layer 216 is formed so as to embed the space between the elements and the electroconductive film. The scan lines 212 and the signal lines 214 are formed so as to sandwich portions of the insulating layer 216 in a mutually intersecting state. The scan lines 212 and the signal lines 214 sandwich the portions of the insulating layer 216 therebetween so as to be insulated from each other. The pixel electrodes 217 are formed in the region enclosed by the scan lines 212 and the signal lines 214. The pixel electrodes 217 have a shape in which the corner part of a quadrangular portion is quadrangularly notched. The configuration is one in which the TFT elements 215 provided with source electrodes, drain electrodes, semiconductor sections, and gate electrodes are incorporated into the portions enclosed by the scan lines 212, the signal lines 214, and the notched portions of the pixel electrodes 217. The TFT elements 215 are switched on and off by applying signals to the scan lines 212 and the signal lines 214 to control the energizing of the pixel electrodes 217.

An alignment film 218 that covers the entire region in which the scan lines 212, the signal lines 214, and the pixel electrodes 217 described above are formed is disposed on the surface that is in contact with the liquid crystal 230 of the element substrate 210.

The opposing substrate 220 has a color filter (hereinafter referred to as "CF") layer 208 formed on the surface facing the element substrate 210 of a glass substrate 201. The CF layer 208 has partition walls 204, a red filter film 205R, a green filter film 205G, and a blue filter film 205B. A black matrix 202 constituting the grid-shaped partition walls 204 is formed on the glass substrate 201, and a bank 203 is formed on the black matrix 202. A quadrangular filter film region 225 is formed by the partition walls 204 composed of the black matrix 202 and the bank 203. The red filter film 205R, the green filter film 205G, or the blue filter film 205B are formed on the filter film region 225. The red filter film 205R, the green filter film 205G, and the blue filter film 205B are formed in the shapes and positions facing the pixel electrodes 217 described above.

A flattening film 206 is disposed on the CF layer 208 (the element substrate 210 side). The opposing electrodes 207 formed from ITO or another transparent electroconductive material are disposed on the flattening film 206. The surface on which the opposing electrodes 207 are formed is made into a substantially flat surface by providing the flattening film 206. The opposing electrodes 207 are formed of a continuous film having a size sufficient for covering the entire region on which the pixel electrodes 217 described above are formed. The opposing electrodes 207 are connected to wiring formed on the element substrate 210 via a conductive part (not shown).

An alignment film 228 that covers the entire surface of the pixel electrodes 217 is provided to the surface in contact with the liquid crystal 230 of the opposing substrate 220. The liquid crystal 230 is filled into the space enclosed by a seal member that bonds together the alignment film 228 of the opposing substrate 220, the alignment film 218 of the element substrate 210, and the element substrate 210 of the opposing substrate 220, in a state in which the element substrate 210 and the opposing substrate 220 have been bonded together.

The liquid crystal display panel 200 has a transmissive configuration, but the liquid crystal display panel may be provided with a reflective layer or a semi-transmissive reflective layer so as to be used as a reflective-type liquid crystal device or a semi-transmissive reflective liquid crystal device.

Mother Opposing Substrate

Next, a mother opposing substrate 201A will be described with reference to FIGS. 4A and 4B. The opposing substrate 220 is divided into sections to form the CF layer 208 or the like described above on the mother opposing substrate 201A acting as the glass substrate 201. The mother opposing substrate 201A is divided and formed into individual opposing substrates 220 (glass substrates 201). FIG. 4A is a plan view schematically showing the planar structure of an opposing substrate, and FIG. 4B is a plan view schematically showing the planar structure of a mother opposing substrate. In the present embodiment, the structure obtained by forming the CF layer 208 or the like on the mother opposing substrate 201A, or the state obtained by forming the CF layer 208 or the like will be referred to as the mother opposing substrate 201A.

The opposing substrate 220 is formed using the glass substrate 201 composed of a transparent quartz glass having a thickness of about 1.0 mm. The opposing substrate 220 has the CF layer 208 formed in portions that do not include a narrow frame region at the periphery of the glass substrate 201, as shown in FIG. 4A. The CF layer 208 is formed by forming a plurality of filter film regions 225 in a dot pattern shape on the surface of the quadrangular glass substrate 201, i.e., a dot matrix shape in the present embodiment, and forming a filter film 205 on the filter film region 225. An alignment mark (not shown) is formed in a position that is not located in the region in which the CF layer 208 of the glass substrate 201 is formed. The alignment mark is used as a reference mark for positioning when the glass substrate 201 is mounted on the manufacturing apparatus of the droplet discharge device 1 or the like or at other times in order to perform various steps for forming the CF layer 208 or the like.

The CF layer 208 of the opposing substrate 220 is formed on the mother opposing substrate 201A in each of the portions that are divided and serve as the glass substrate 201, as shown in FIG. 4B.

Color Filter

Figure 5:
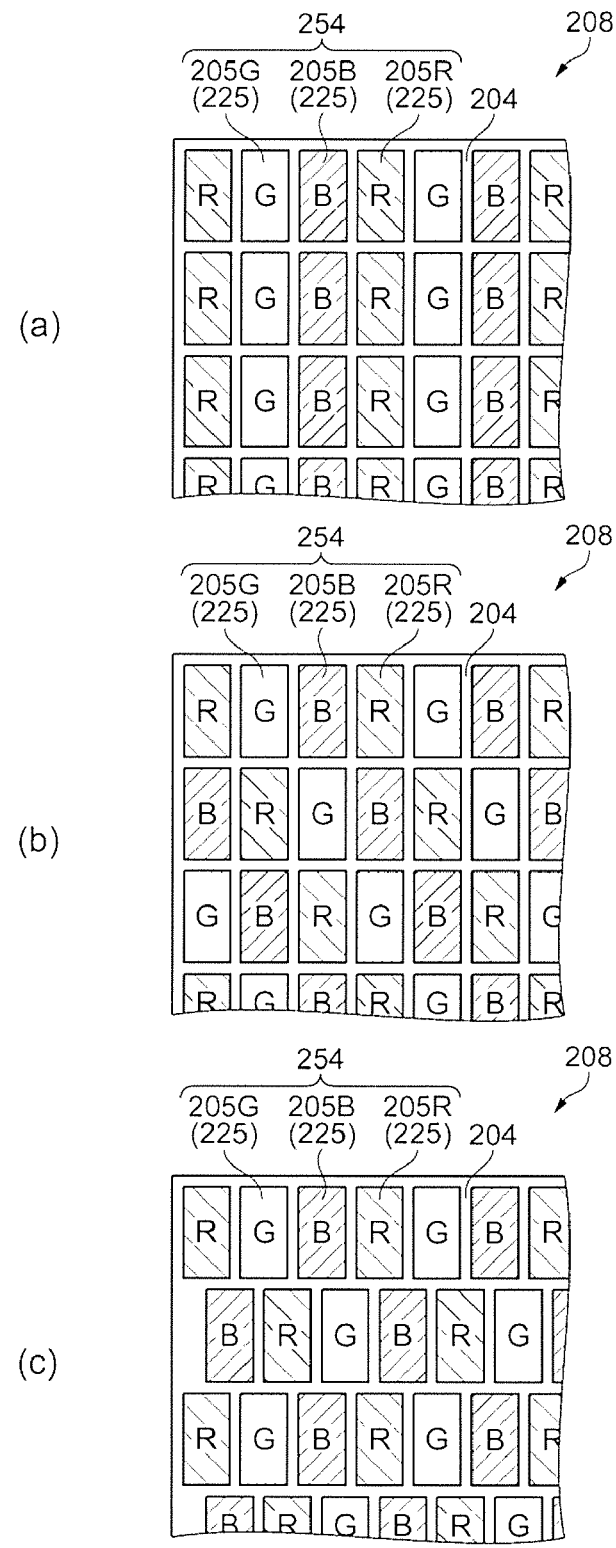
FIG. 5 is a schematic plan view showing an example of an arrangement of filter films of a tricolored color filter.

Described next with reference to FIG. 5 is the CF layer 208 formed on the opposing substrate 220 and the array of filter films 205 (the red filter film 205R, the green filter film 205G, and the blue filter film 205B) in the CF layer 208. FIG. 5 is a schematic plan view showing an example of an array of filter films of a tricolored color filter The filter film 205 is partitioned by the partition walls 204 formed in a grid-shaped pattern using a non-transmissive resin material and is formed by using color materials to embed a plurality of, e.g., the quadrangular filter film regions 225 aligned in the form of a dot matrix, as shown in FIG. 5. For example, the functional liquid containing color materials that will constitute the filter film 205 is filled into the filter film region 225, and the solvent of the functional liquid is allowed to evaporate and the functional liquid is allowed to dry to form the film-like filter film 205 for embedding the filter film region 225. The filter film region 225 corresponds to the film formation area, and the filter films 205 correspond to the films. The functional liquid containing the color materials that will constitute the filter films 205 corresponds to the liquid containing a film material.

A stripe array, a mosaic array, and a delta array are known examples of formats in which the red filter film 205R, the green filter film 205G, and the blue filter film 205B are arranged in the tri-colored filter. FIG. 5(a) is a schematic plan view showing a stripe array, FIG. 5(b) is a schematic plan view showing a mosaic array; and FIG. 5(c) is a schematic plan view showing a delta array.

A strip array is an array composed of the red filter film 205R, the green filter film 205G, or the blue filter film 205B, in which all of the longitudinal columns of a matrix have the same color, as shown in FIG. 5(a). A mosaic array is an array in which the filter films 205 are offset by a single color for each row in the lateral direction, and is a tricolor array of three of the filter films 205 aligned in the lateral and longitudinal directions in the case of a tricolor filter, as shown in FIG. 5(b). A delta array is a color arrangement in which the arrangement of the filter films 205 is set in a stepped configuration and any three adjacent filter films 205 differ in color in the case of a tricolor filter, as shown in FIG. 5(c).

In the three color filters shown in FIGS. 15(a), (b), or (c), the filter films 205 are formed by any single color material among R (red), G (green), and B (blue). A filter composed of picture elements (hereinafter referred to as "picture element filter 254"), which are the smallest units constituting an image, are formed in a group of filter films 205 that include one each of the red filter film 205R, the green filter film 205G, and the blue filter film 205B formed adjacent to each other. A full color display is carried out by adjusting the luminous energy of light to be transmitted and by selectively transmitting light using one or any combination of the red filter film 205R, the green filter film 205G, and the blue filter film 205B, in a single picture element filter 254.

Filter Layer Formation

Figure 6:
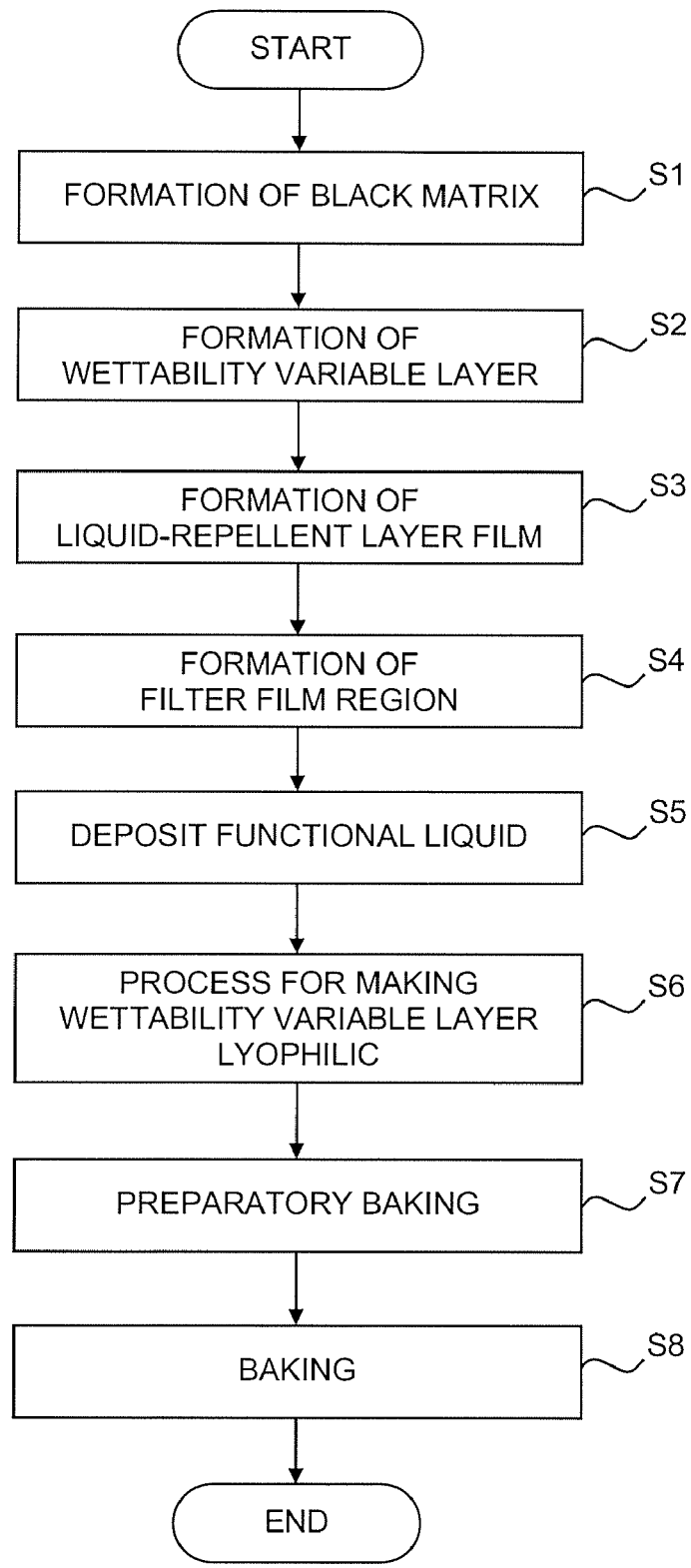
FIG. 6 is a flowchart that shows the process for forming a filter layer.
Figure 7:
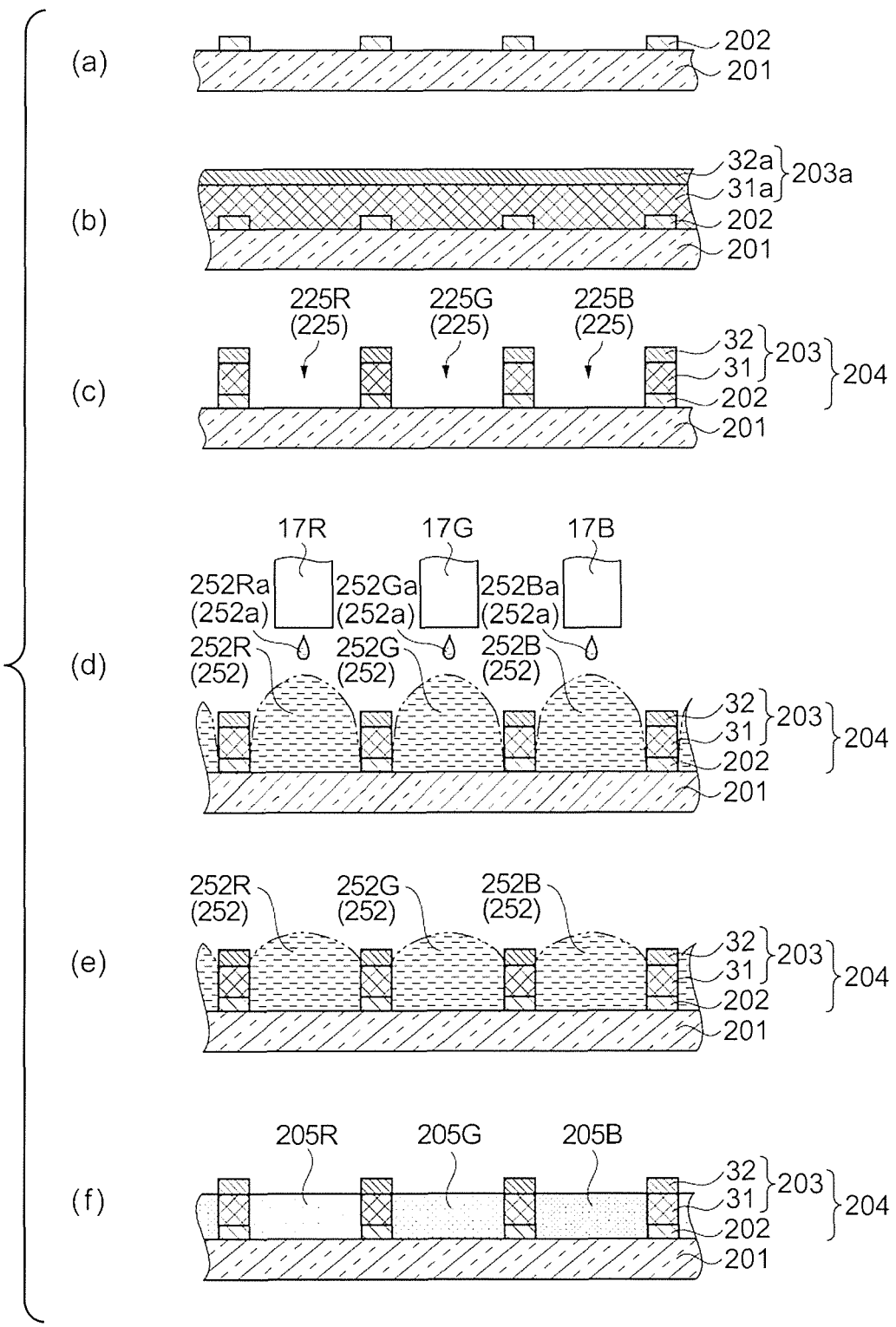
FIG. 7 is a cross-sectional view showing the process for forming a filter layer.

The steps for forming the liquid crystal display panel 200 will be described next. First, the step for forming the CF layer 208 will be described with reference to FIGS. 6 and 7. FIG. 6 is a flowchart that shows the process for forming a filter layer. FIG. 7 is a cross-sectional view showing the steps for forming a filter film.

In step S1 of FIG. 6, the black matrix 202 is formed in a grid shape on the glass substrate 201, as shown in FIG. 7(a).

Next, in step S2, a wettability variable layer film 31a constituting a bank film 203a is formed so as to cover the grid of the black matrix 202. The wettability variable layer film 31a is composed of a material in which the wettability can be varied in relation to the functional liquid containing the material that will constituted the filter films 205. Examples of wettability-variable materials include polymers of perfluoro acrylate monomers, polymers of perfluoro methacrylate monomers, heat sensitive gels composed of N,N-dimethyl acrylamide, and heat sensitive gels composed of isopropyl acrylamide. Polymers of perfluoro acrylate monomers and polymers of perfluoro methacrylate monomers exhibit liquid repellency at room temperature, and lose liquid repellency when heated to about 150° C. Heat sensitive gels composed of N,N-dimethyl acrylamide and heat sensitive gels composed of isopropyl acrylamide exhibit liquid repellency at room temperature, and demonstrate liquid affinity (lyophilicity or lipophilicity) when heated to about 30° C. or higher.

An example of another material that can vary wettability is titanium oxide. Titanium oxide demonstrates hydrophilicity when irradiated with UV rays (wavelength: about 300 nm). Titanium oxide is a colorless transparent powder and is used in mixtures with other binders, for example.

Next, in step S3 of FIG. 6, a liquid-repellent layer film 32a constituting the bank film 203a is formed so as to cover the wettability variable layer film 31a. The bank film 203a that covers the portion composed of the black matrix 202 and the filter film region 225 on the glass substrate 201 is formed by carrying out step S3, as shown in FIG. 7(b).

Next, in step S4 of FIG. 6, the filter film region 225 is formed. Positions or other portions in which the filter film region 225 is to be formed are photo etched away to form the filter film region 225 in the bank film 203a formed on the glass substrate 201. Step S4 is carried out to form the partition walls 204, which include the bank 203 composed of the black matrix 202, a wettability variable layer 31, and a liquid-repellent layer 32, on the glass substrate 201, as shown in FIG. 7(c). In other words, the quadrangular filter film region 225 is formed by being partitioned by the partition walls 204 formed in the shape of a grid as described above.

Since the liquid-repellent layer 32 has liquid repellent properties, the upper surface of the partition walls 204 is liquid repellent. The wettability variable layer 31 is formed in a state in which the wettability-variable material is liquid repellent. Therefore, most of the side surface of the partition walls 204 is liquid repellent.

Filter film regions 225 for forming the red filter film 205R, the green filter film 205G, and the blue filter film 205B will be referred to as a red filter film region 225R, a green filter film region 225G, and a blue filter film region 225B.

Next, in step S5 of FIG. 6, functional liquid containing material that will constitute the filter films 205 is deposited in the filter film region 225. The functional liquid 252 containing the material that will constitute the red filter film 205R, the green filter film 205G, or the blue filter film 205B will be referred to as the red functional liquid 252R, the green functional liquid 252G, and the blue functional liquid 252B. The droplet discharge head 17 for discharging the red functional liquid 252R, and the green functional liquid 252G, or the blue functional liquid 252B will be referred to as the red discharge head 17R, the green discharge head 17G, and the blue droplet discharge head 17B.

The droplet discharge head 17 is made to face the surface of the glass substrate 201 on which the filter film region 225 partitioned by the partition walls 204 has been formed, as shown in FIG. 7(d), in order to deposit the functional liquid 252. The red functional liquid 252R is deposited in the red filter film region 225R by discharging droplets 252Ra of the red functional liquid 252R from the discharge nozzles 78 of the red discharge head 17R toward the red filter film region 225R in which the red filter film 205R is to be formed. At the same time, the red functional liquid 252R is deposited in all the red filter film regions 225R formed on the glass substrate 201, by moving the red discharge head 17R in a relative fashion with respect to the glass substrate 201. Similarly, the green functional liquid 252G or the blue functional liquid 252B is deposited in the green filter film region 225G or the blue filter film region 225B, which are regions for forming the green filter film 205G or the blue filter film 205B. The green functional liquid 252G or the blue functional liquid 252B is deposited by discharging droplets 252Ga of the green functional liquid 252G or droplets 252Ba of the blue functional liquid 252B using the green droplet discharge head 17G or the blue droplet discharge head 17B.

As described above, the upper surface of the partition walls 204 is liquid repellent because the liquid-repellent layer 32 has liquid repellency. Accordingly, the functional liquid 252 is repelled by the surface of the partition walls 204 and is very likely to flow into the filter film region 225 even if a portion of the droplets of the functional liquid 252 discharged from the droplet discharge head 17 rides up and becomes deposited on the partition walls 204.

The liquid-repellent layer 32 constituting the upper surface of the partition walls 204 has liquid repellency and the wettability variable layer 31 is formed in a state in which the wettability-variable material is liquid repellent, most of the side surface of the partition walls 204 is liquid repellent. The red functional liquid 252R, the green functional liquid 252G, or the blue functional liquid 252B disposed in the red filter film region 225R, the green filter film region 225G, or the blue filter film region 225B is repelled from the side surface of the partition walls 204, and the functional liquid 252 has difficulty making contact with the partition walls 204. In other words, the functional liquid 252 has difficulty wetting and spreading to the edge of the partition walls 204 in the filter film region 225.

Therefore, as long as the functional liquid 252 is not fed in excess so as to overflow from the filter film region 225, it is very unlikely that the functional liquid 252 deposited in the filter film region 225 will ride up on the partition walls 204, and it is very unlikely that the functional liquid 252 deposited in a different filter film region 225 will pass over the partition walls 204 and mix with other functional liquid.

Next, in step S6 of FIG. 6, the wettability variable layer 31 is made liquid affinity property in a state in which the functional liquid 252 has been deposited in the filter film region 225. The partition walls 204, which have the wettability variable layer 31, are formed and the glass substrate 201 on which the functional liquid 252 has been deposited is heated in the case that the wettability variable layer 31 is, e.g., a material that exhibits liquid affinity at a set temperature or higher. The partition walls 204 having the wettability variable layer 31 are formed and the glass substrate 201 on which the functional liquid 252 has been deposited is irradiated with light for making the wettability variable layer 31 with liquid affinity when the wettability variable layer 31 is, e.g., a material that exhibits liquid affinity when irradiated with a specific light. The step for making the wettability variable layer 31 with liquid affinity corresponds to the wettability variation step.

The side surface of the partition walls 204 is more readily wetted by the functional liquid 252 when the wettability variable layer 31 is made liquid affinity property. Therefore, the functional liquid 252 deposited in the filter film region 225 wets and spreads to the side surface of the partition walls 204 and wets and spreads over the entire filter film region 225, as shown in FIG. 7(e).

The functional liquid 252 is subsequently temporarily baked in step S7. Preparatory baking involves, e.g., heating and curing the functional liquid 252 until the functional liquid 252 no longer flows. The functional liquid 252 that has wet and spread over the entire filter film region 225 is cured, as shown in FIG. 7(e), thereby forming the filter films 205 (the red filter film 205R, the green filter film 205G, and the blue filter film 205B) filled completely into the filter film region 225, as shown in FIG. 7(f).

In the case that the step for making the wettability variable layer 31 with liquid affinity and the step for temporarily baking the functional liquid 252 are both heating steps, the steps can be carried out using a single heating step. In this case, the partition walls 204 having the wettability variable layer 31 are formed, and the environmental temperature of the glass substrate 201 on which the functional liquid 252 has been deposited is controlled so that the functional liquid 252 is temporarily baked after the process for making the wettability variable layer 31 with liquid affinity has sufficiently progressed.

The filter films 205 are subsequently baked in step S8. The filter films 205 (the red filter film 205R, the green filter film 205G, and the blue filter film 205B) thus temporarily baked are further baked to form sufficiently cured filter films 205 (the red filter film 205R, the green filter film 205G, and the blue filter film 205B). Step S8 is carried out and the step for forming the CF layer 208 is ended.

Formation of Liquid Crystal Display Panel

Figure 8:
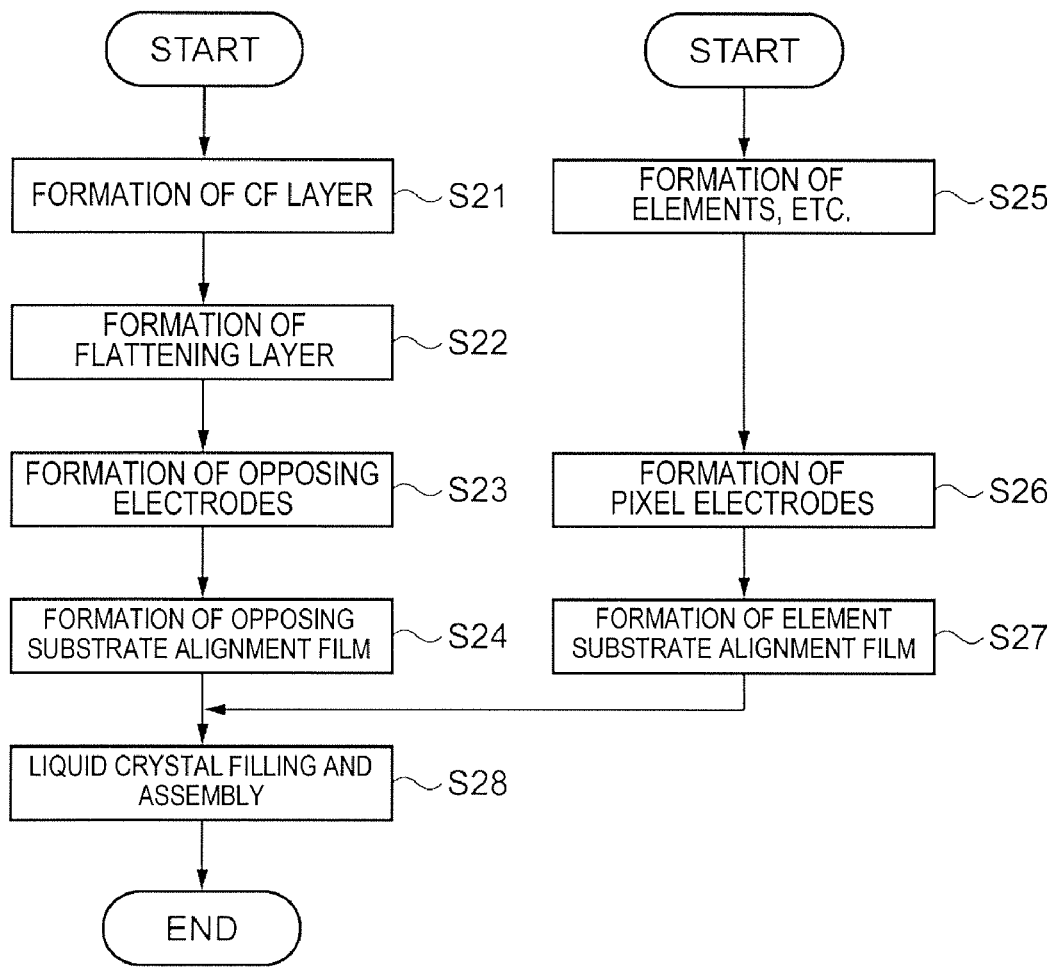
FIG. 8 is a flowchart that shows the process for forming a liquid crystal display panel.
Figure 9:
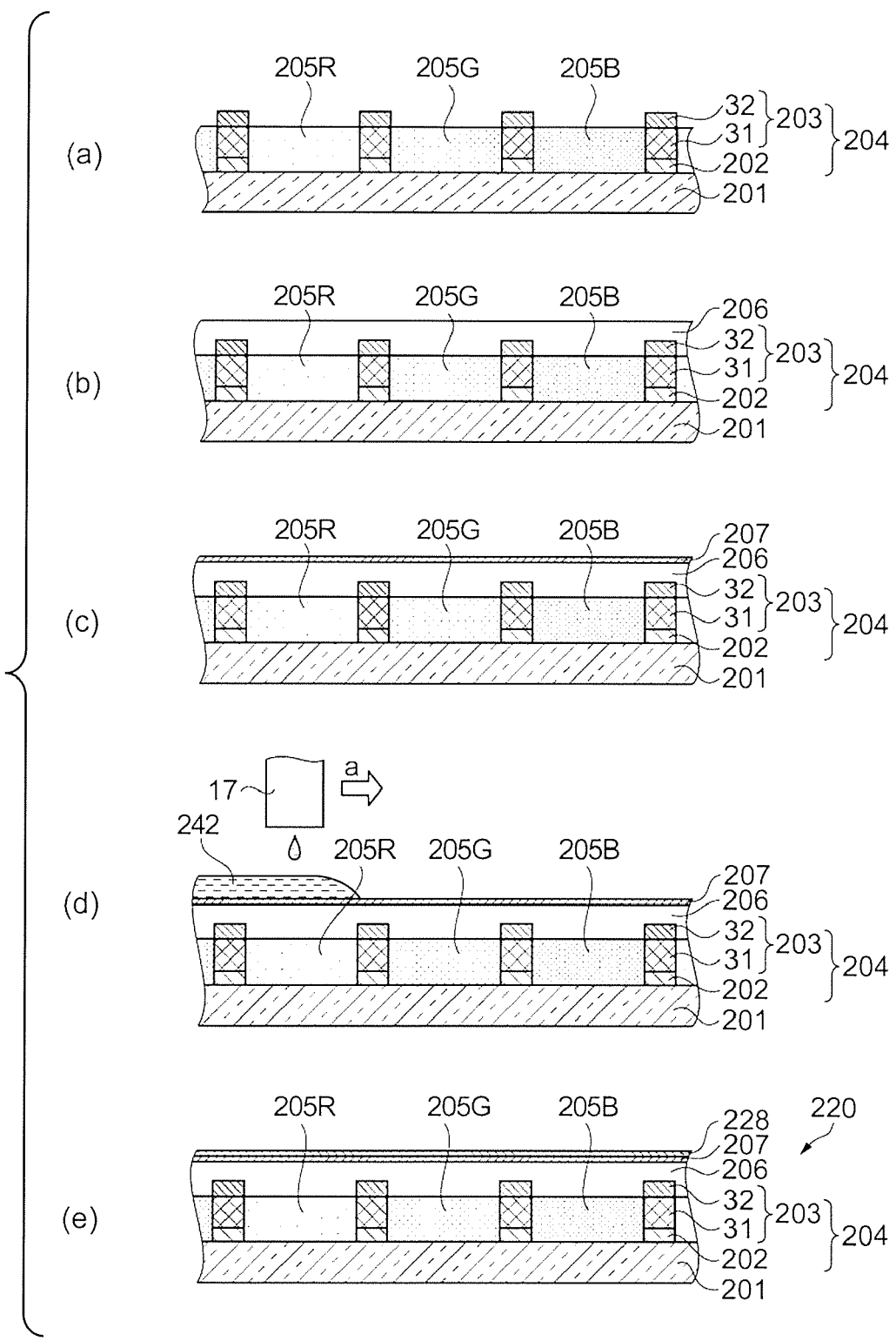
FIG. 9 is a cross-sectional view showing the steps for forming a filter film in the process for forming a liquid crystal display panel.

The steps for forming the liquid crystal display panel 200 following the formation of the CF layer 208 will be described next with reference to FIGS. 8, 9, and 10. FIG. 8 is a flowchart that shows the process for forming a liquid crystal display panel. FIG. 9 is a cross-sectional view showing the steps or the like for forming an opposing substrate in the process for forming a liquid crystal display panel. FIG. 10 is a cross-sectional view showing the steps or the like for forming an element substrate in the process for forming a liquid crystal display panel. The liquid crystal display panel 200 is formed by bonding together the element substrate 210 and the opposing substrate 220, which are separately formed.

The opposing substrate 220 is formed by carrying out steps S21 through S25 shown in FIG. 8.

Step S21 is a step for carrying out steps S1 to S8 described above to form the CF layer 208. The CF layer 208 is formed on the element substrate 210, as shown in FIG. 9(a), by carrying out the CF layer formation step, which is step S21.

Next, a flattening layer is formed in the step S22 of FIG. 8. The flattening film 206 as the flattening layer is formed on the partition walls 204 as well as on the red filter film 205R, the green filter film 205G, and the blue filter film 205B constitut-ing the CF layer 208, as shown in FIG. 9(b). The flattening film 206 is formed in the region that covers at least the entire CF layer 208. The surface that forms the opposing electrodes 207 is made a substantially flat surface by providing the flattening film 206.

Next, the opposing electrodes 207 are formed in step S23 of FIG. 8. A thin film is formed using a transparent electroconductive material in the region on the flattening film 206 that covers the entire surface of the region in which at least the filter films 205 of the CF layer 208 are formed, as shown in FIG. 9(c). This thin film is the opposing electrodes 207 described above.

Next, the alignment film 228 of the opposing substrate 220 is formed on the opposing electrodes 207 in step S24 of FIG. 8. The alignment film 228 is formed in the region that covers at least the entire surface of the CF layer 208.

The droplet discharge head 17 is made to face the surface of the glass substrate 201 on which the opposing electrodes 207 are formed, as shown in FIG. 9(d), and an alignment film liquid 242 is discharged from the droplet discharge head 17 toward the surface of the glass substrate 201. At the same time, the discharge head 17 is moved in a relative fashion with respect to the glass substrate 201 in the manner indicated by the arrow a, whereby the alignment film liquid 242 is deposited over the entire surface of the region in which the alignment film 228 of the glass substrate 201 is to be formed. The alignment film 228 is formed by drying the deposited alignment film liquid 242, as shown in FIG. 9(e). The opposing substrate 220 is thus formed by carrying out step S24.

The element substrate 210 is formed by carrying out steps S25 to S27 shown in FIG. 8.

In step S25, the TFT elements 215 and other elements, the scan lines 212, the signal lines 214, and the insulating layer 216 and the like are formed by forming an electroconductive layer, an insulating layer, and semiconductor layer on the glass substrate 211. The scan lines 212 and the signal lines 214 are formed in positions facing the partition walls 204, i.e., in positions at the periphery of the pixels in a state in which the element substrate 210 and the opposing substrate 220 have been bonded together. The TFT elements 215 are formed so as to be positioned at the edge of the pixels, and at least one TFT element 215 is formed on a single pixel.

The pixel electrodes 217 are formed next in step S26. The pixel electrodes 217 are formed in positions facing the red filter film 205R, the green filter film 205G, and the blue filter film 205B in a state in which the element substrate 210 and the opposing substrate 220 have been bonded together. The pixel electrodes 217 are electrically connected to the drain electrodes of the TFT elements 215.

Next, in step S27, the alignment film 218 of the element substrate 210 is formed on the pixel electrodes 217 or the like. The alignment film 218 is formed in a region that covers the entire surface of at least the all the pixel electrodes 217.

The droplet discharge head 17 is made to face the surface of the glass substrate 211 on which the pixel electrodes 217 are formed, and the alignment film liquid 242 is discharged from the droplet discharge head 17 toward the surface of the glass substrate 211, as shown in FIG. 10(f). At the same time, the discharge head 17 is moved in a relative fashion with respect to the glass substrate 211 in the manner indicated by the arrow a, whereby the alignment film liquid 242 is deposited over the entire surface of the region in which the alignment film 218 of the glass substrate 211 is to be formed. The alignment film 218 is formed by drying the deposited alignment film liquid 242, as shown in FIG. 10(g). The element substrate 210 is thus formed by carrying out step S27.

Next, in step S28 shown in FIG. 8, the opposing substrate 220 and the element substrate 210 thus formed are bonded together and the liquid crystal 230 is filled therebetween, as shown in FIG. 10(h). A polarizing plate 231 and a polarizing plate 232 are furthermore bonded or otherwise affixed to complete the assembly of the liquid crystal display panel 200. A mother substrate on which a plurality of liquid crystal display panels 200 is formed is divided into individual liquid crystal display panels 200 in the case that a plurality of opposing substrates 220 and element substrates 210 are formed on the mother substrate composed of a plurality of glass substrates 201 and glass substrates 211. Alternatively, step S28 is carried out after the step for dividing the mother opposing substrate 201A and the mother element substrate into the opposing substrates 220 and the element substrates 210. Step S28 is carried out and the step for forming the liquid crystal display panel 200 is ended.

The effects of the first embodiment are described below. According to the first embodiment, the following effects can be obtained.

(1) Since the liquid-repellent layer 32 for forming the partition walls 204, which partition and form the filter film region 225, is liquid repellent, the upper surface of the partition walls 204 is liquid repellent. Most of the side surface of the partition walls 204 is liquid repellent because the wettability variable layer 31 for forming the partition walls 204 is formed in a state in which the wettability-variable material is liquid repellent. Since the functional liquid 252 is deposited in the filter film region 225, the functional liquid that has ridden up onto the partition walls 204 is very likely to be repelled by the liquid-repellent layer 32 and flow down into the filter film region 225, and the functional liquid can be prevented from remaining on the partition walls 204.

The functional liquid 252 inside the filter film region 225 is repelled by the liquid-repellent wettability variable layer 31 and has difficulty wetting and spreading to the edge of the partition walls 204. Therefore, the possibility that the functional liquid 252 deposited in the filter film region 225 will ride up on the partition walls 204 is very low and it is possible to significantly minimize the possibility that the functional liquid 252 deposited in a different filter film region 225 will pass over the partition walls 204 and mix with other functional liquid.

(2) The functional liquid 252 is deposited in the filter film region 225, and the wettability variable layer 31 is thereafter made liquid affinity property prior to preparatory baking. The side surface of the partition walls 204 is more readily wetted by the functional liquid 252 by making the wettability variable layer 31 to be made liquid affinity property. Therefore, the functional liquid 252 deposited in the filter film region 225 wets and spreads to the side surface of the partition walls 204 and wets and spreads over the entire filter film region 225. The filter films 205 can thereby be formed without gaps over the entire surface of the filter film region 225.

Second Embodiment

Described next with reference to the drawings is a second embodiment as an embodiment of the film-formation method, method for manufacturing an electro-optical device, electro-optical device, and electronic apparatus. The present embodiment will be described using a film-formation method as an example in which a step is used for forming a hole-transport layer and a luminescent layer, which are examples of a functional film, in the step for manufacturing an organic EL display device, which is an example of an electro-optical device. The droplet discharge device used in the present embodiment is essentially the same as the droplet discharge device 1 described in the first embodiment.

Configuration of Organic EL Display Device

First, the configuration of an organic EL display device will be described with reference to FIGS. 11, 12, and 13. FIG. 11 is a schematic front view showing the plan configuration of the organic EL display device. FIG. 12 is a plan view showing the arrangement example of the organic EL display device.

An organic EL display device 300 is provided with a sealed substrate 309 and an element substrate 301 having a plurality of organic EL elements 307 as light-emitting elements, as shown in FIG. 11. The organic EL elements 307 are so-called color elements, and the organic EL display device 300 has three colored organic EL elements 307, namely, a red element 307R (red colors), a green element 307G (green colors), and a blue element 307B (blue colors), as shown in FIG. 12. The organic EL elements 307 are disposed in a display region 306, and an image is displayed in the display region 306.

The tricolored organic EL elements 307 on the element substrate 301 are formed by being partitioned by the partition walls 204 formed in a grid-shaped pattern using a non-transmissive resin material and forming the luminescent layer 317 (see FIG. 13) or the like in a plurality of, e.g., the quadrangular regions aligned in the form of a dot matrix, as shown in FIGS. 12(a) and 12(b). For example, the functional liquid containing materials that will constitute the luminescent layer 317 and the hole-transport layer 316 (see FIG. 13) constituting the organic EL elements 307 is filled into the region partitioned by the partition wall 315, and the solvent of the functional liquid is allowed to evaporate and the functional liquid is allowed to dry to form the hole-transport layer 316 and the luminescent layer 317.

The element substrate 301 is provided with a plurality of switching elements 312 (see FIG. 13) as drive elements in positions that correspond to the organic EL elements 307. The switching elements 312 are, e.g., TFT (Thin Film Transistor) elements. Two scan line drive circuits 303 for driving the switching elements 312 and a single data line drive circuit 304 are provided to the portion that protrudes in the shape of a frame so as to be somewhat larger than the sealed substrate 309. A flexible relay substrate 308 for connecting the scan line drive circuits 303 or the data line drive circuit 304 to an external drive circuit is mounted on a terminal section 301a of the element substrate 301. The scan line drive circuits 303 and the data line drive circuit 304 are configured by, e.g., forming in advance a low-temperature polysilicon semiconductor layer on the surface of the element substrate 301.

A stripe array, a mosaic array, and a delta array are known examples of arrays of the organic EL elements 307. A strip array is an array composed of the organic EL elements 307 in which all of the longitudinal columns of a matrix have the same color, as shown in FIG. 12(a). A mosaic array is an array in which the organic EL elements 307 are offset by a single color for each row in the lateral direction, and is a tricolor array of any three of the organic EL elements 307 aligned in the lateral and longitudinal directions in the case of a tricolor organic EL display device, as shown in FIG. 12(b). A delta array (not shown in FIG. 12) is a color arrangement in which the arrangement of the organic EL elements 307 is set in a stepped configuration and any three adjacent organic EL elements 307 differ in color in the case of a tricolor organic EL display device, as shown in FIG. 5(c).

Figure 13:
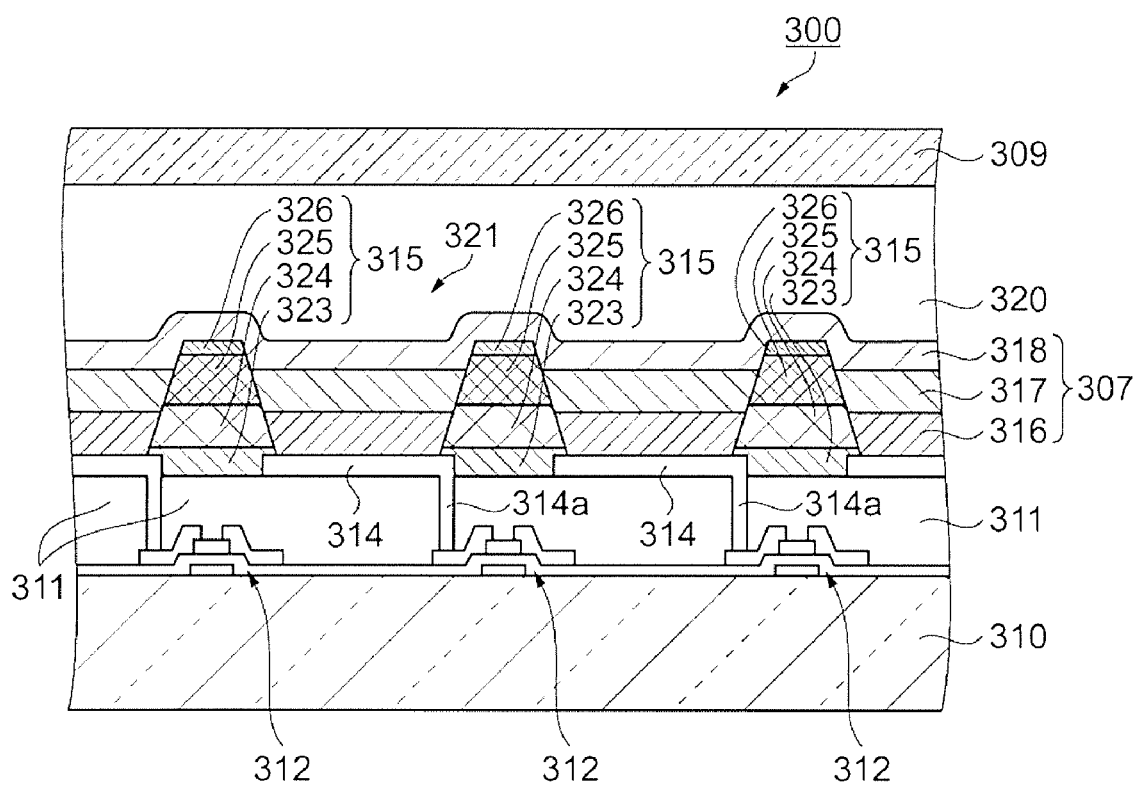
FIG. 13 is a cross-sectional view of the main parts including the organic EL elements of the organic EL display device.

FIG. 13 is a cross-sectional view of the main parts including the organic EL elements of the organic EL display device. The element substrate 301 has a glass substrate 310, a plurality of switching elements 312 formed one of the surfaces of the glass substrate 310, an insulating layer 311 formed so as to cover the switching elements 312, a plurality of pixel electrodes 314 connected to the switching elements 312 via a conductive layer 314a, and partition walls 315 formed between the plurality of pixel electrodes 314, as shown in FIG. 13. Also provided are a hole-transport layer 316 formed on the pixel electrodes 314 in the region partitioned by the partition walls 315 (hereinafter referred to as "pixel region 321"), a luminescent layer 317 layered and formed on the hole-transport layer 316, and opposing electrodes 318 provided so as to cover the luminescent layer 317 and the partition walls 315. The partition walls 315 are formed by layering in sequence a light-blocking layer 323, a first wettability variable layer 324, a second wettability variable layer 325, and a liquid-repellent layer 326 on the glass substrate 310. The first wettability variable layer 324 corresponds to the first partition wall layer and the second wettability variable layer 325 corresponds to the second partition wall layer.

The organic EL display device 300 is configured so that the sealed substrate 309 faces the opposing electrodes 318 of the element substrate 301, and an inert gas 320 is sealed between the opposing electrodes 318 and the sealed substrate 309. The hole-transport layer 316, luminescent layer 317, and opposing electrodes 318 formed on the pixel electrodes 314 of the pixel region 321 partitioned by the partition walls 315 correspond to the organic EL elements 307.

The red element 307R, the green element 307G, and the blue element 307B are formed on the pixel region 321 by forming a red luminescent layer 317R (red colors), a green luminescent layer 317G (green colors), and a blue luminescent layer 317B (blue colors) for emitting red, green, and blue light, respectively. Picture elements as the smaller units constituting an image are formed by an assembly of organic EL elements 307 containing one each of the red element 307R, the green element 307G, and the blue element 307B. A full color display is carried out by selectively emitting light using one or any combination of the red element 307R, the green element 307G, and the blue element 307B in the a single picture element.

Manufacture of Organic EL Display Device

Figure 14:
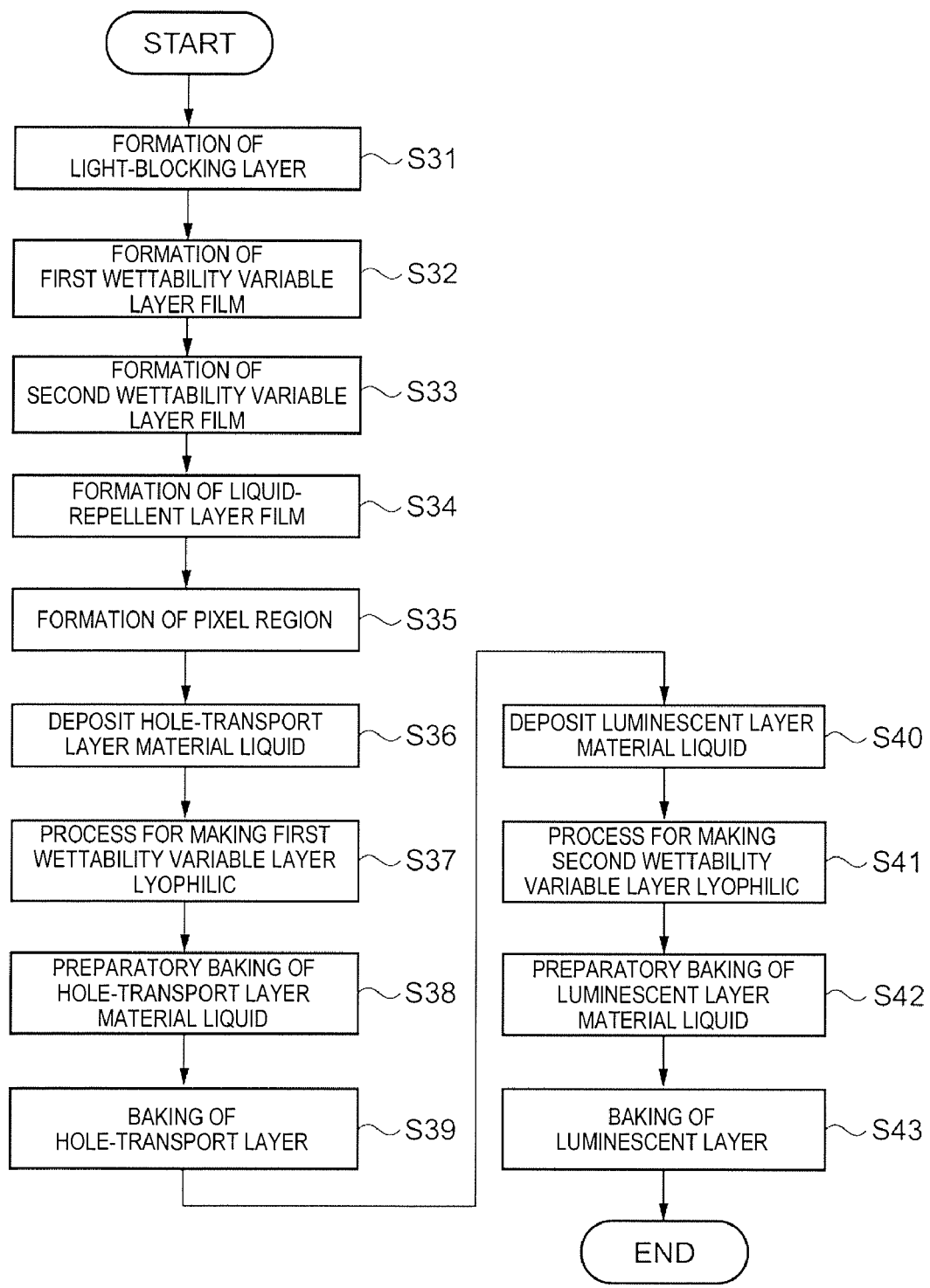
FIG. 14 is a flowchart that shows the process for forming a luminescent layer and a hole-transport layer of the element substrate.
Figure 15:
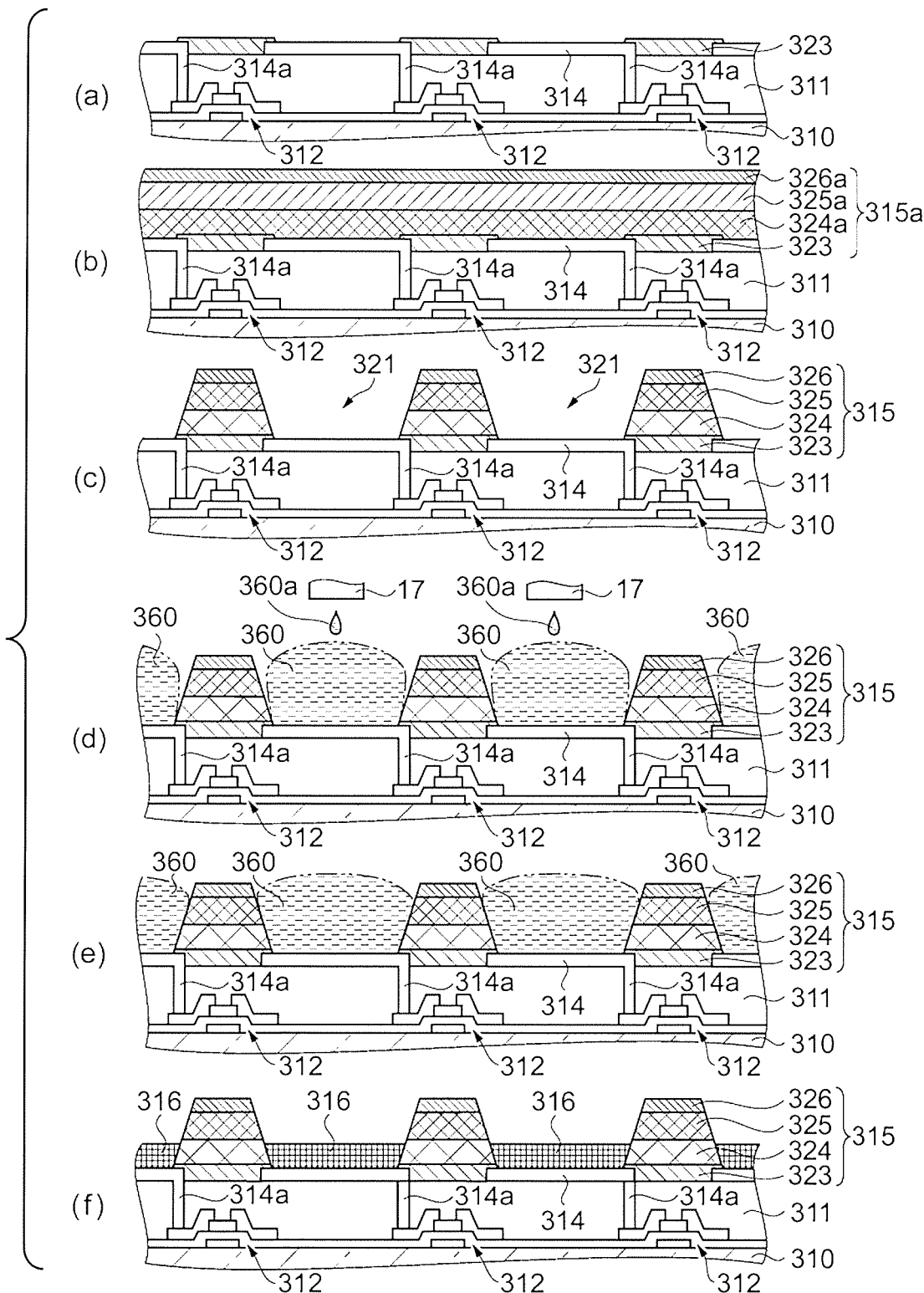
FIG. 15 is a schematic cross-sectional view showing the process for forming a luminescent layer and a hole-transport layer of the element substrate.
Figure 16:
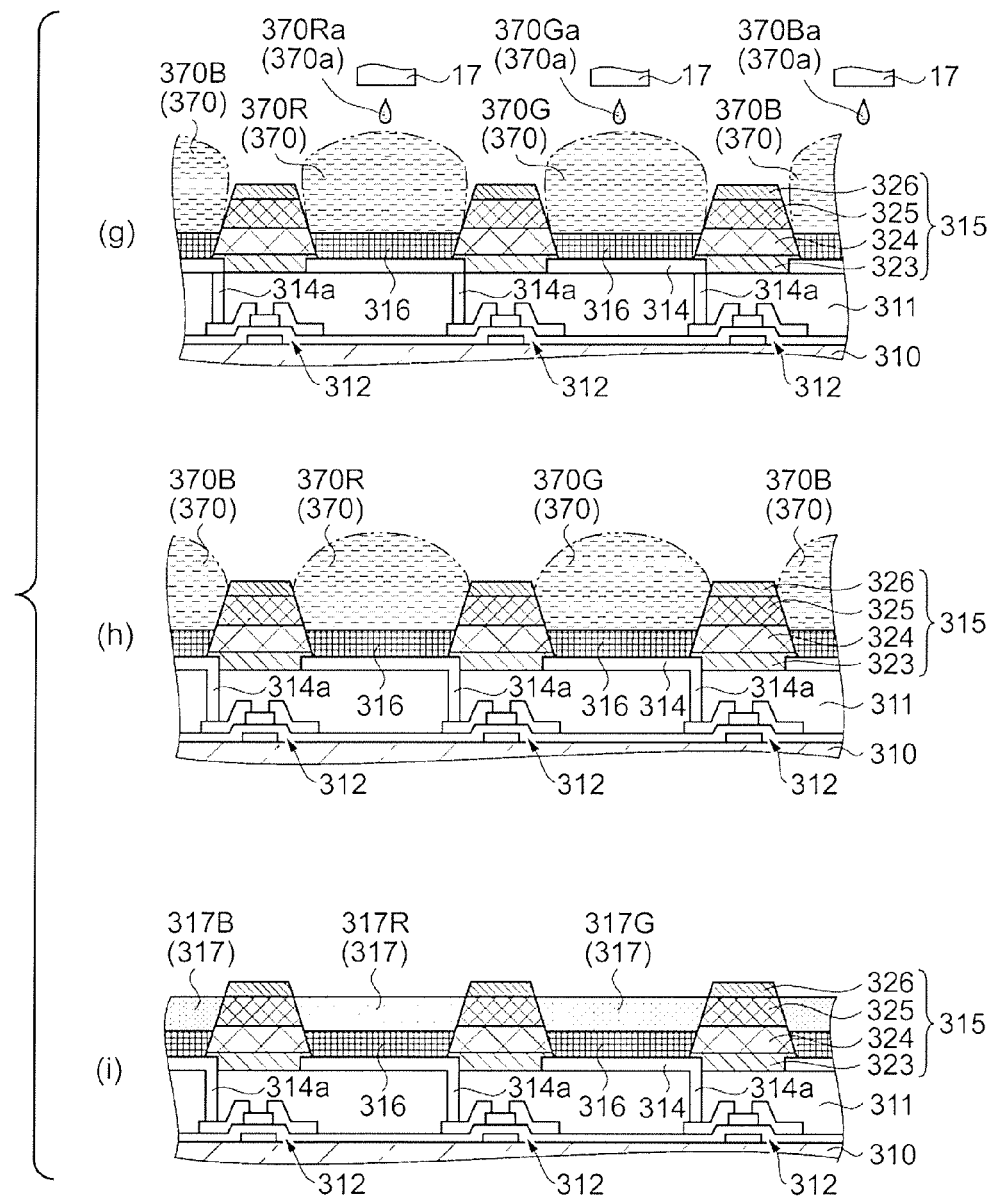
FIG. 16 is a schematic cross-sectional view showing the process for forming a luminescent layer and a hole-transport layer of the element substrate.

Next, the steps for forming the hole-transport layer 316 and the luminescent layer 317 constituting the organic EL elements 307 on the element substrate 301 of the organic EL display device 300 will be described with reference to FIGS. 14, 15, and 16. FIG. 14 is a flowchart that shows the process for forming a luminescent layer and a hole-transport layer of the element substrate. FIGS. 15 and 16 are schematic cross-sectional views showing the process for forming a luminescent layer and a hole-transport layer of the element substrate.

In step S31 of FIG. 14, a light-blocking layer 323 is formed in a grid shape on the surface of the glass substrate 310 on which are formed the switching elements 312, the insulating layer 311, the conductive layer 314a, and the pixel electrodes 314, as shown in FIG. 15(a).

Next, in step S32 of FIG. 14, a first wettability variable layer film 324a is formed so as to cover the grid of the light-blocking layer 323. The first wettability variable layer film 324a is composed of a material in which the wettability can be varied in relation to the functional liquid containing the material that will constitute the hole-transport layer 316.

Next, in step S33 of FIG. 14, a second wettability variable layer film 325a is formed so as to cover the first wettability variable layer film 324a. The second wettability variable layer film 325a is composed of a material in which the wettability can be varied in relation to the functional liquid containing the material that will constitute the luminescent layer 317.

Next, in step S34 of FIG. 14, a liquid-repellent layer film 326a is formed so as to cover the second wettability variable layer film 325a. Step S34 is carried out to form a partition wall film 315a, which covers the light-blocking layer 323 and the portion that will serve as the pixel region 321 on the glass substrate 310, as shown in FIG. 15(b).

Next, the pixel region 321 is formed in step S35 of FIG. 14. Positions or other portions in which the pixel region 321 is to be formed are photo etched away to thereby form the pixel region 321 in the partition wall film 315a formed on the glass substrate 201. Step S35 is carried out and the light-blocking layer 323, the first wettability variable layer 324, the second wettability variable layer 325, and the liquid-repellent layer 326 are layered on the glass substrate 310 in sequence from the glass substrate 310 side to form the partition walls 315, as shown in FIG. 15(c). In other words, the pixel region 321, which has a substantially quadrangular shape in terms of the planar shape, is formed by being partitioned by the partition walls 315 formed in the shape of a grid as described above.

Since the liquid-repellent layer 326 has liquid repellency, the upper surface of the partition walls 315 is liquid repellent. Most of the side surface of the partition wall 315 is liquid repellent because the first wettability variable layer 324 and the second wettability variable layer 325 are formed in a state in which the wettability-variable material is liquid repellent.

Next, in step S36 of FIG. 14, a hole-transport layer material liquid 360 containing material that will constitute the hole-transport layer 316 is deposited in the pixel region 321. The droplet discharge head 17 is made to face the surface of the glass substrate 310 on which the pixel region 321 partitioned by the partition walls 315 are formed, as shown in FIG. 15(d), in order to deposit the hole-transport layer material liquid 360. The hole-transport layer material liquid 360 is deposited in the pixel region 321 by discharging droplets 360a of the hole-transport layer material liquid 360 from the discharge nozzles 78 of the droplet discharge head 17 toward the pixel region 321.

As described above, the upper surface of the partition walls 315 is liquid repellent because the liquid-repellent layer 326 has liquid repellency. Accordingly, the hole-transport layer material liquid 360 is repelled by the surface of the partition walls 315 and is very likely to flow into the pixel region 321 even if a portion of the droplets 360a of the hole-transport layer material liquid 360 discharged from the droplet discharge head 17 rides up and becomes deposited on the partition walls 315.

The liquid-repellent layer 326 constituting the upper surface of the partition walls 315 has liquid repellency and the first wettability variable layer 324 and the second wettability variable layer 325 are formed in a state in which the wettability-variable material is liquid repellent. Therefore, most of the side surface of the partition walls 315 is liquid repellent. The hole-transport layer material liquid 360 deposited in the pixel region 321 is repelled from the side surface of the partition walls 315, and the hole-transport layer material liquid 360 has difficulty making contact with the partition walls 315. In other words, the hole-transport layer material liquid 360 has difficulty wetting and spreading to the edge of the partition walls 315 in the pixel region 321. Therefore, as long as the hole-transport layer material liquid 360 is not fed in excess so as to overflow from the pixel region 321, it is very unlikely that the hole-transport layer material liquid 360 deposited in the pixel region 321 will ride up on the partition walls 315, and it is very unlikely that the hole-transport layer material liquid 360 will remain on the partition walls 315.

Next, the first wettability variable layer 324 is made liquid affinity property in step S37 of FIG. 14. The partition walls 315, which have the first wettability variable layer 324, are formed and the glass substrate 310 on which the hole-transport layer material liquid 360 has been deposited is heated in the case that the first wettability variable layer 324 is, e.g., a material that exhibits liquid affinity at a set temperature or higher. The partition walls 315, which have the first wettability variable layer 324, are formed and the glass substrate 310 on which the hole-transport layer material liquid 360 has been deposited is irradiated with light for making the first wettability variable layer 324 with liquid affinity in the case that the first wettability variable layer 324 is, e.g., a material that exhibits liquid affinity when irradiated with a specific light. At this point, the partition walls 315 or the first wettability variable layer 324 can be selectively irradiated with light using a mask. The hole-transport layer material liquid 360 can be prevented from being exposed to light by selectively irradiating the light. The step for making the first wettability variable layer 324 with liquid affinity corresponds to the wettability variation step.

At this point, the materials must be selected so that the process for making the first wettability variable layer 324 with liquid affinity is different than the process for making the second wettability variable layer 325 with liquid affinity because the second wettability variable layer 325 must be made to retain liquid repellency. For example, the second wettability variable layer 325 is formed using a material that is made liquid affinity property by irradiation with light in the case that the first wettability variable layer 324 is formed using a material that is made liquid affinity property by the application of heat. Alternatively, the material constituting the first wettability variable layer 324 and the material constituting the second wettability variable layer 325 are materials that are made liquid affinity property using different temperatures or are materials that are made liquid affinity property using different light.

The first wettability variable layer 324 becomes liquid affinity, whereby the hole-transport layer material liquid 360 deposited in the pixel region 321 can be made to wet and spread to the side surface of the partition walls 315 and can be made to wet and spread over the entire pixel region 321 because the base side (the glass substrate 310 side) of the side surface of the partition walls 315 is more readily wetted by the hole-transport layer material liquid 360, as shown in FIG. 15(e).

Next, the hole-transport layer material liquid 360 is subsequently temporarily baked in step 38. Preparatory baking involves, e.g., heating and curing the hole-transport layer material liquid 360 until the hole-transport layer material liquid 360 no longer flows. The hole-transport layer material liquid 360 that has wet and spread over the entire pixel region 321 is cured, as shown in FIG. 15(e), thereby forming the hole-transport layer 316 filled completely into the pixel region 321, as shown in FIG. 15(f).

The hole-transport layer 316 is subsequently baked in step S39. The hole-transport layer 316 thus temporarily baked is further baked to form a sufficiently cured hole-transport layer 316. Step S39 is completed and a hole-transport layer 316 is formed, as shown in FIG. 15(f).

At this point, the materials are selected so that the process for temporarily baking or baking the hole-transport layer 316 is different from the process for making the second wettability variable layer 325 with liquid affinity because the second wettability variable layer 325 must be made to retain liquid repellency.

Next, in step S40, the luminescent layer material liquid 370 is deposited on the hole-transport layer 316 of the pixel region 321. The luminescent layer material liquid 370 containing the material of the luminescent layer 317 is discharged as droplets 370a from the droplet discharge head 17 toward the plurality of pixel regions 321 in which the hole-transport layer 316 is formed and the luminescent layer material liquid 370 is deposited on the hole-transport layer 316 of the pixel region 321, as shown in FIG. 16(g). The luminescent layer material liquid 370 containing the luminescent layer material is, of course, discharged to each pixel region 321 in which the different-colored luminescent layers 317 are formed. For example, droplets 370Ra, droplets 370Ga, or droplets 370Ba of the luminescent layer material liquid 370R, the luminescent layer material liquid 370G, or the luminescent layer material liquid 370B containing the luminescent layer material for forming the luminescent layers 317 are discharged from the droplet discharge head 17 toward the pixel region 321 in which the red luminescent layer 317R (red colors), the green luminescent layer 317G (green colors), and the blue luminescent layer 317B (blue colors) are to be formed for emitting red, green, and blue lights in the case of a color display (see FIG. 12) that uses the tricolored luminescent layer described above.

As described above, the upper surface of the partition walls 315 is liquid repellent because the liquid-repellent layer 326 has liquid repellency. Accordingly, the luminescent layer material liquid 370 is repelled by the surface of the partition walls 315 and flows into the pixel region 321 even if a portion of the droplets 370a of the luminescent layer material liquid 370 discharged from the droplet discharge head 17 rides up on the partition walls 315.

The liquid-repellent layer 326 constituting the upper surface of the partition walls 315 is liquid repellent and the second wettability variable layer 325 is formed in a state in which the wettability-variable material is liquid repellent. Therefore, most of the side surface of the partition walls 315 is liquid repellent. The luminescent layer material liquids 370R, 370G, 370B deposited in the pixel region 321 is repelled from the side surface of the partition walls 315, as shown in FIG. 16(g), the luminescent layer material liquid 370 has difficulty making contact with the partition walls 315. In other words, the luminescent layer material liquid 370 has difficulty wetting and spreading to the edge of the partition walls 315 in the pixel region 321.

Therefore, as long as the luminescent layer material liquid 370 is not fed in excess so as to overflow from the pixel region 321, it is very unlikely that the luminescent layer material liquid 370 deposited in the pixel region 321 will ride up on the partition walls 315. Since such a possibility is very low, it is very unlikely that the luminescent layer material liquid 370R, the luminescent layer material liquid 370G, or the luminescent layer material liquid 370B deposited in a different pixel region 321 will pass over the partition walls 315 and mix with other material liquid.

Next, the second wettability variable layer 325 is made liquid affinity property in step S41 of FIG. 14. The partition walls 315, which have the second wettability variable layer 325, are formed and the glass substrate 310 on which the luminescent layer material liquid 370 has been deposited is heated in the case that the second wettability variable layer 325 is, e.g., a material that exhibits liquid affinity at a set temperature or higher. The partition walls 315, which have the second wettability variable layer 325, are formed and the glass substrate 310 on which the luminescent layer material liquid 370 has been deposited is irradiated with light for making the second wettability variable layer 325 with liquid affinity in the case that the second wettability variable layer 325 is, e.g., a material that exhibits liquid affinity when irradiated with a specific light. At this point, the partition walls 315 or the second wettability variable layer 325 can be selectively irradiated with light using a mask. The luminescent layer material liquid 370 can be prevented from being exposed to light by selectively irradiating the light, whereby the luminescent layer material liquid 370 can be prevented from being affected by the light. The step for making the second wettability variable layer 325 with liquid affinity corresponds to the wettability variation step.

The second wettability variable layer 325 becomes liquid affinity, whereby the luminescent layer material liquid 370 deposited in the pixel region 321 can be made to wet and spread to the side surface of the partition walls 315 and can be made to wet and spread over the entire pixel region 321 because the side surface of the partition walls 315 is more readily wetted by the luminescent layer material liquid 370, as shown in FIG. 16(h).

The luminescent layer material liquid 370 is subsequently temporarily baked in step S42. Preparatory baking involves, e.g., irradiating and curing the luminescent layer material liquid 370 with UV rays until the luminescent layer material liquid 370 no longer flows. The luminescent layer material liquid 370 that has wet and spread over the entire pixel region 321 is cured, as shown in FIG. 16(h), thereby forming the luminescent layer 317 (the red luminescent layer 317R, green luminescent layer 317G, and blue luminescent layer 317B) filled completely into the pixel region 321, as shown in FIG. 16(i).

The luminescent layer 317 (the red luminescent layer 317R, green luminescent layer 317G, and blue luminescent layer 317B) are subsequently baked in step S43. The luminescent layer 317 thus temporarily baked is further baked to form a sufficiently cured luminescent layer 317. Step S43 is ended and the luminescent layers 317 (red luminescent layer 317R, green luminescent layer 317G, blue luminescent layer 317B) are formed, as shown in FIG. 16(i). Step S43 is carried out and the step for forming the hole-transport layer and the luminescent layer is ended.

The effects of the second embodiment are described below. According to the second embodiment, the following effects can be obtained in addition the effects of the first embodiment.

(1) Since the liquid-repellent layer 326 for forming the upper surface of the partition walls 315 is liquid repellent, the upper surface of the partition walls 315 is liquid repellent. Accordingly, the hole-transport layer material liquid 360 is repelled by the surface of the partition walls 315 and is very likely to flow into the pixel region 321 even if a portion of the droplets 360a of the hole-transport layer material liquid 360 discharged from the droplet discharge head 17 rides up and becomes deposited on the partition wall 315. It is therefore possible to prevent the hole-transport layer material liquid 360 from becoming deposited on the partition walls 315.

Since most of the side surface of the partition walls 315 is liquid repellent, the hole-transport layer material liquid 360 deposited in the pixel region 321 is repelled from the side surface of the partition walls 315, and the hole-transport layer material liquid 360 has difficulty wetting and spreading to the edge of the partition walls 315. Accordingly, it is very unlikely that the hole-transport layer material liquid 360 deposited on the pixel region 321 will ride up onto the partition walls 315, and it is also very unlikely that the hole-transport layer material liquid 360 will be present on the partition walls 315.

(2) The first wettability variable layer 324 is made liquid affinity property in a state in which the hole-transport layer material liquid 360 has been deposited in the pixel region 321. The first wettability variable layer 324 becomes liquid affinity, whereby the hole-transport layer material liquid 360 deposited in the pixel region 321 can be made to wet and spread to the side surface of the partition walls 315 and can be made to wet and spread over the entire pixel region 321 because the base side of the side surface of the partition walls 315 is more readily wetted by the hole-transport layer material liquid 360.

(3) Materials in which the process for making the materials with liquid affinity are mutually different are used for the material constituting the first wettability variable layer 324 and the material constituting the second wettability variable layer 325. The second wettability variable layer 325 can be prevented from being made liquid affinity property when the process for making the first wettability variable layer 324 with liquid affinity is carried out.

(4) Since the liquid-repellent layer 326 for forming the partition walls 315 is liquid repellent, the upper surface of the partition walls 315 is liquid repellent. Accordingly, the luminescent layer material liquid 370 is repelled by the surface of the partition walls 315 and is very likely to flow into the pixel region 321 even if a portion of the droplets 370a of the luminescent layer material liquid 370 discharged from the droplet discharge head 17 rides up and becomes deposited on the partition walls 315. It is therefore possible to prevent the luminescent layer material liquid 370 from becoming deposited on the partition wall 315.

Most of the side surface of the partition walls 315 is liquid repellent in a state in which the hole-transport layer 316 has be formed, because the liquid-repellent layer 326 constituting the upper surface of the partition walls 315 is liquid repellent and the second wettability variable layer 325 is formed in a state in which the wettability-variable material has liquid repellency. Accordingly, it is very unlikely that the luminescent layer material liquid 370 deposited on the pixel region 321 will ride up onto the partition walls 315, and it is also very unlikely that the luminescent layer material liquid 370 deposited in different pixel regions 321 will pass over the partition walls 315 and mix together.

(5) The luminescent layer material liquid 370 is deposited in the pixel region 321, and the second wettability variable layer 325 is thereafter made liquid affinity property prior to preparatory baking. The side surface of the partition walls 315 is more readily wetted by the luminescent layer material liquid 370 by making the second wettability variable layer 325 to be made liquid affinity property. Therefore, the luminescent layer material liquid 370 deposited in the pixel region 321 wets and spreads to the side surface of the partition walls 315 and wets and spreads over the entire pixel region 321. The luminescent layer 317 can thereby be formed without gaps over the entire surface of the pixel region 321.

Third Embodiment

Described next with reference to the drawings is a third embodiment as an embodiment of the film-formation method, method for manufacturing an electro-optical device, electro-optical device, and electronic apparatus. The present embodiment will be described in relation to another example of a configuration of the partition walls formed in the step for manufacturing the color filter of a liquid crystal display device described in the first embodiment.

Configuration Example 1 of Partition Walls

The configuration and formation process of partition walls 404 having a different configuration from the partition walls 204 described in the first embodiment will be described with reference to FIG. 17. FIG. 17 is a cross-sectional view showing the process for configuration the partition walls.

First, the black matrix 202 is formed in a grid shape on the glass substrate 201 described in the first embodiment, in the manner described with reference to FIG. 7(a) in the first embodiment.

Next, a liquid-repellent layer film 432a is formed so as to cover the grid of the black matrix 202, as shown in FIG. 17(a). The liquid-repellent layer film 432a is composed of a material having liquid repellency with respect to the functional liquid containing the material that will constitute the filter films 205 in the same manner as the liquid-repellent layer film 32a described in the first embodiment.

Next, a portion of the liquid-repellent layer film 432a is removed to form a liquid-repellent layer 432, as shown in FIG. 17(b). An enlarged filter film region 425A having a size that includes the filter film region 425 shown in the FIG. 17(d) is formed by forming the liquid-repellent layer 432. The enlarged filter film region 425A is formed on the liquid-repellent layer film 432a formed on the glass substrate 201 by photo etching away or using another method to remove positions or other portions about the periphery thereof for forming the filter film region 425.

Next, a wettability variable layer film 431a is formed so as to embed the enlarged filter film region 425A, as shown in FIG. 17(c). The wettability variable layer film 431a is composed of a material in which wettability can be varied in relation to the functional liquid that contains the material that will constitute the filter films 205 in the same manner as the wettability variable layer film 31a described in the first embodiment.

Next, the filter film region 425 is formed, as shown in FIG. 17(d). The filter film region 425 is formed on the wettability variable layer film 431a, which is formed in the enlarged filter film region 425A on the glass substrate 201, by photo etching away or using another method to remove the portion in the positions in which the filter film region 425 is to be formed. Formed on the black matrix 202 are the liquid-repellent layer 432 and the partition walls 404 in which a wettability variable layer 431 has been formed so as to sandwich the liquid-repellent layer 432, as shown in FIG. 17(d). In other words, the quadrangular filter film region 425 partitioned by the partition walls 404 formed in the shape of a grid are formed in the same manner as the filter film region 225 described above in the first embodiment.

The partition walls 406 shown in FIG. 17(e) are partition walls having a wettability variable layer 441 having a different cross-sectional shape than the wettability variable layer 431 of the partition walls 404. The wettability variable layer 441 has a triangular cross section and is composed of a surface that connects to the black matrix 202, a surface that connects to the liquid-repellent layer 432, and a surface that faces a filter film region 426, by etching in the depth and width directions when the filter film region 426 is formed.

Configuration Example 2 of Partition Walls

Figure 18:
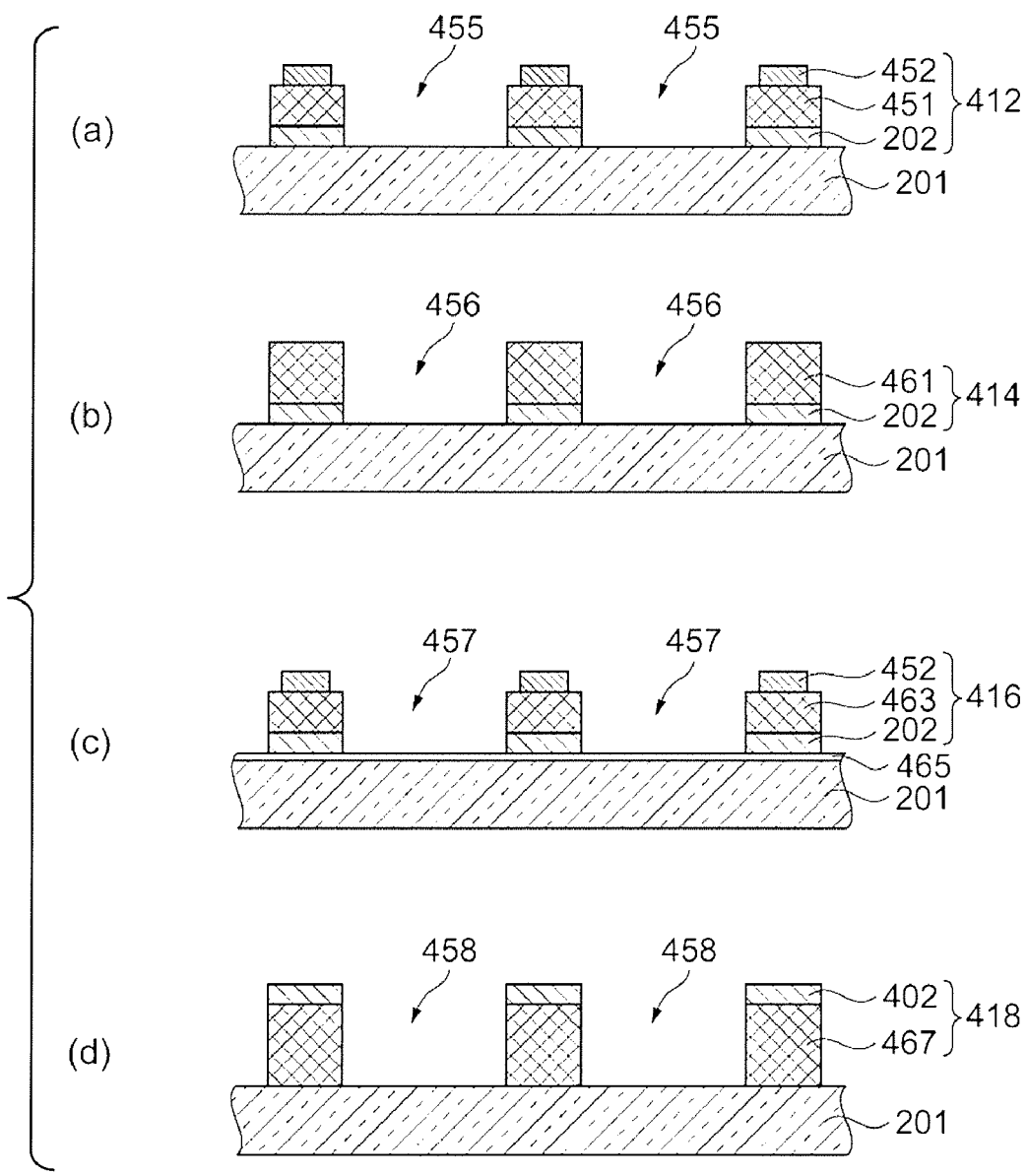
FIG. 18 is a cross-sectional view showing the process for configuring the partition walls.

The configuration example of partition walls having a different configuration from the partition walls 204 described in the first embodiment will be described with reference to FIG. 18. FIG. 18 is a cross-sectional view showing the configuration example of the partition walls.

The partition walls 412 shown in FIG. 18(a) have a black matrix 202, a wettability variable layer 451, and a liquid-repellent layer 452. A filter film region 455 is partitioned and formed by the partition walls 412. As described in FIG. 7(a) in the first embodiment, the black matrix 202 is formed in a grid shape on the glass substrate 201 described in the first embodiment. The wettability variable layer 451 is layered on the black matrix 202, and the width is substantially the same as the black matrix 202. The wettability variable layer 451 is composed of a material in which the wettability can be varied in relation to the functional liquid containing the material that will constitute the filter film. The liquid-repellent layer 452 is layered on the wettability variable layer 451 and the width is less than that of the wettability variable layer 451. The liquid-repellent layer 452 is composed of a material having liquid repellency with respect to the functional liquid containing the material that will constitute the filter films in the same manner as the liquid-repellent layer 32 described in the first embodiment.

When the wettability variable layer 451 is made liquid affinity property in a state in which the functional liquid has been deposited in the filter film region 455, the functional liquid deposited in the filter film region 455 wets and spreads to the portions not covered by the liquid-repellent layer 452 of the upper surface of the wettability variable layer 451. Since the portion that has wet and spread to the upper surface of the wettability variable layer 451 is outside of the range of the filter film region 455 in the planar direction, the edge of the filter film is outside of the range of the filter film region 455 in this portion. The shape of the edge portion near the surface of the filter film can thereby be prevented from affecting the function of the filter film formed in the filter film region 455.

The functional liquid can be more readily bonded to the surface facing the filter film region 455 of the wettability variable layer 451 in comparison with a configuration in which the surface of the liquid-repellent layer 452 having liquid repellency extends in a continuous fashion with the surface of the facing wettability variable layer 451, because the surface on the filter film region 455 side of the liquid-repellent layer 452 is set at a distance away from the surface of the wettability variable layer 451 facing the filter film region 455.

The partition walls 414 shown in FIG. 18(b) have a black matrix 202 and a wettability variable layer 461. The filter film region 456 is partitioned and formed by the partition walls 414. As described in FIG. 7(a) in the first embodiment, the black matrix 202 is formed in a grid shape on the glass substrate 201 described in the first embodiment. The wettability variable layer 461 is layered on the black matrix 202, and the width is substantially the same as that of the black matrix 202. The wettability variable layer 461 is composed of a material in which the wettability can be varied in relation to the functional liquid containing the material that will constitute the filter film.

When the functional liquid is deposited in the filter film region 456, the functional liquid can be prevented from remaining on the partition walls 414 by making the wettability variable layer 461 to be liquid repellency. When the functional liquid deposited in the filter film region 456 is to be solidified, the functional liquid acclimates to the partition walls 414 by making the wettability variable layer 461 to be made liquid affinity property in advance, and the functional liquid deposited in the filter film region 456 can be made to uniformly wet and spread over the entire surface of the filter film region 456.

When the wettability variable layer 461 is made to be liquid affinity property, the height of the partition walls 414 is preferably set to a height at which the functional liquid to be deposited in the filter film region 456 is sufficiently contained in order to prevent the functional liquid from passing over the partition walls 414.

The partition walls 414 do not have a liquid-repellent film on the top section. Therefore, the time required for forming the liquid-repellent film can be saved and time required to manufacture a color filter or the like can be reduced. Even when the functional liquid has been filled into the filter film region 456, the process for generating liquid affinity or other processes can be carried out using an operation that directly acts on the partition walls 414 because at least the top section of the partition walls 414 is not covered by the functional liquid.

The filter film region 416 shown in FIG. 18(c) has a black matrix 202, a wettability variable layer 463, and a liquid-repellent layer 452. A wettability variable film 465 is formed on the glass substrate 201. The wettability variable film 465 is composed of a material in which the wettability can be varied in relation to the functional liquid containing the material that will constitute the filter film. The black matrix 202 is formed in a grid shape on the wettability variable film 465 in the manner described with reference to FIG. 7(a) in the first embodiment. The wettability variable layer 463 is layered on the black matrix 202, and the width is substantially the same as that of the black matrix 202. The liquid-repellent layer 452 is layered on the wettability variable layer 463 and the width is less than that of the wettability variable layer 463. The wettability variable layer 463 is composed of a material in which the wettability can be varied in relation to the functional liquid containing the material that will constitute the filter film. The liquid-repellent layer 452 is composed of a material having liquid repellency in relation to the functional liquid containing the material that will constituting the filter film in the same manner as the liquid-repellent layer 32 described in the first embodiment.

In the case that the functional liquid is to be deposited in a filter film region 457, the functional liquid deposited in the filter film region 457 can be more readily made to flow inside the filter film region 457 by making the wettability variable film 465 to be liquid repellent. When the functional liquid deposited in the filter film region 457 is to be solidified, the functional liquid acclimates to the wettability variable film 465 that forms the bottom surface of the filter film region 457 by making the wettability variable film 465 to be made liquid affinity property prior to the operation for solidifying the functional liquid, and the functional liquid deposited in the filter film region 457 can be made to uniformly wet and spread over the entire surface of the filter film region 457.

The partition walls 418 shown in FIG. 18(d) have a wettability variable layer 467 and a liquid-repellent layer 402. A filter film region 458 is partitioned and formed by the partition walls 418. The partition walls 418 are formed in a grid shape on the glass substrate 201 described in the first embodiment, in the same manner as the black matrix 202 described with reference to FIG. 7(a) in the first embodiment. The liquid-repellent layer 402 has liquid repellency with respect to the functional liquid containing the material that will constitute the filter films in the same manner as the liquid-repellent layer film 32 described in the first embodiment, and is composed of a material having light-blocking properties.

In the case that the functional liquid is to be deposited in a filter film region 458, the functional liquid can be prevented from remaining on the partition walls 418 by making the wettability variable layer 467 to be liquid repellent. When the functional liquid deposited in the filter film region 457 is to be solidified, the functional liquid acclimates to the partition walls 418 by making the wettability variable layer 467 to be made liquid affinity property in advance, and the functional liquid deposited in the filter film region 458 can be made to uniformly wet and spread over the entire surface of the filter film region 458.

Since the liquid-repellent layer 402 is composed of a material having light-blocking properties, the filter film region 458 can be optically partitioned. Accordingly, a light-blocking layer such as the black matrix 202 is not required to be separately formed and the time required to form the light-blocking layer can be saved.

Fourth Embodiment

Described next with reference to the drawings is a fourth embodiment as an embodiment of the film-formation method, method for manufacturing an electro-optical device, electro-optical device, and electronic apparatus. The present embodiment will be described in relation to an example of the film-formation method used in the step for forming a wiring pattern formed using a wiring film as an example of a functional film, in a step for manufacturing a semiconductor array substrate such as an element substrate of a liquid crystal display device as an example of an electro-optical device. The droplet discharge device used in the present embodiment is essentially the same as the droplet discharge device 1 described in the first embodiment.

First, the thin film transistors (TFT) in a semiconductor array substrate will be described with reference to FIGS. 19 and 20. FIG. 19 is a plan view showing the schematic configuration of a portion containing a single TFT on a TFT array substrate. FIG. 20 is a cross-sectional view showing the schematic configuration of a portion containing a single TFT on a TFT array substrate. FIG. 20(a) is a cross-sectional view of a portion containing a TFT, and FIG. 20(b) is a cross-sectional view of a portion in which the gate lines and the source lines intersect in a planar fashion A TFT array substrate 510 having TFTs 530 is provided with a gate line 512, a source line 516, a drain electrode 514, and a pixel electrode 519 that is electrically connected to the drain electrode 514, as shown in FIG. 19. The gate line 512 is formed so as to extend in the X-axis direction and a portion of the gate line is formed so as to extend in the Y-axis direction. The portion of the gate line 512 that extends in the Y-axis direction is used as a gate electrode 511. The width of the gate electrode 511 is less than that of the gate line 512. The gate line 512 is formed used the film-formation method of the present embodiment. A portion of the source line 516 formed so as to extend in the Y-axis direction is formed with a greater width, and the portion of the source line 516 is used as a source electrode 517. The source line 516 is formed using the film-formation method of the present embodiment.

The gate line 512 and the gate electrode 511 are formed between a bank 504 disposed on the substrate 501, as shown in FIG. 20. The gate line 512, the gate electrode 511, and the bank 504 are covered by an insulating film 528, and formed on the insulating film 528 are an active layer 563 as a semiconductor layer, the source line 516, the source electrode 517, the drain electrode 514, and the bank 506. The active layer 563 is disposed in a position substantially facing the gate electrode 511, and the portion facing the gate electrode 511 of the active layer 563 is used as a channel region. Joining layers 564a and 564b are layered on the active layer 563. The source electrode 517 is joined to the active layer 563 via the joining layer 564a and the drain electrode 514 is joined to the same via the joining layer 564b. The source electrode 517 and the joining layer 564a, and the drain electrode 514 and the joining layer 564b, are insulated from each other by a bank 567 disposed on the active layer 563. The gate line 512 is insulated from the source line 516 by the insulating film 528, and the gate electrode 511 is insulated from the source electrode 517 and the drain electrode 514 by the insulating film 528. The source line 516, the source electrode 517, and the drain electrode 514 are covered by and insulating film 529. A contact hole is formed in the portion that covers the drain electrode 514 of the insulating film 529, and the pixel electrode 519 that connects to the drain electrode 514 via the contact hole is formed on the upper surface of the insulating film 529.

The bank 504 is composed of a wettability variable layer 531 and a liquid-repellent layer 532. The wettability variable layer 531 is formed using a material in which the wettability can be varied in relation to the functional liquid containing the material that will form the wiring film. The liquid-repellent layer 532 is formed using a material having liquid repellency with respect to the functional liquid containing the material that will form the wiring film. The thickness of the wettability variable layer 531 is set to be slightly greater than that of the gate line 512 and the gate electrode 511. A bank 506 is composed of a wettability variable layer 535 and a liquid-repellent layer 534. The wettability variable layer 535 is formed using a material in which the wettability can be varied in relation to the functional liquid containing the material that will form the wiring film. The liquid-repellent layer 534 is formed using a material having liquid repellency with respect to the functional liquid containing the material that will form the wiring film. The thickness of the wettability variable layer 535 is set to be slightly greater than that of the source line 516, the source electrode 517, and the drain electrode 514.

The element substrate 210 described in the first embodiment is a TFT array substrate having TFT elements 215. The TFT elements 215 correspond to the TFTs 530, the pixel electrode 217 corresponds to the pixel electrode 519, the scan line 212 corresponds to the gate line 512, and the signal line 214 corresponds to the source line 516.

Next, the process for forming the film pattern of the gate line 512 and the gate electrode 511 will be described.

Formed first on the substrate 501 is the bank 504 in which the portion for forming the gate line 512 and the gate electrode 511 is formed as a groove. The bank 504 is formed by forming the wettability variable layer 531 on the substrate 501 and layering the liquid-repellent layer 532 on the wettability variable layer 531. At this point, the wettability variable layer 531 facing the wiring groove in which the gate line 512 and the gate electrode 511 will be formed has liquid repellency with respect to the functional liquid containing the material that will form the wiring layer.

Next, a wiring functional liquid is deposited on the wiring groove of the bank 504 using the droplet discharge device 1 described in the first embodiment, for example. At this point, it is possible that a portion of the droplets of the wiring functional liquid discharged toward the wiring groove will land on the bank 504, but the upper surface of the bank 504 is the liquid-repellent layer 532 that is liquid repellent with respect to wiring functional liquid. Therefore, the wiring functional liquid on the upper surface of the bank 504 is repelled and flows into the wiring groove.

Next, the wettability of the surface of the wettability variable layer 531 facing the wiring groove is made to be liquid affinity property with respect to the wiring functional liquid. The wiring functional liquid is thereby made to acclimate to the surface of the wettability variable layer 531 and is filled so as to spread over the entire cross section of the wiring groove.

Next, the wiring functional liquid is solidified and the film of the gate line 512 and the gate electrode 511 is formed.

Next, the process for forming a film pattern of the source line 516, the source electrode 517, and the drain electrode 514 will be described.

First, a bank 506 in which the portion that forms the source line 516, the source electrode 517, and the drain electrode 514 in the form of a groove is formed on the insulating film 528 for covering the gate line 512, the gate electrode 511, and the bank 504. The bank 506 is formed by forming a wettability variable layer 535 on the insulating film 528 and layering the liquid-repellent layer 534 on the wettability variable layer 535. At this point, the wettability variable layer 535 facing the wiring groove in which the source line 516, the source electrode 517, and the drain electrode 514 are to be formed has liquid repellency with respect to the wiring functional liquid containing the material that will form the wiring film.

The wiring functional liquid is subsequently deposited in the wiring groove of the bank 506 using the droplet discharge device 1 described in the first embodiment, for example. At this time, it is possible that a portion of the droplets of the wiring functional liquid discharged toward the wiring groove has landed on the bank 506, but since the upper surface of the bank 506 is the liquid-repellent layer 534, which is liquid repellent with respect to the wiring functional liquid, the wiring functional liquid that has landed on the bank 506 is repelled and flows into the wiring groove.

Next, the wettability of the surface of the wettability variable layer 535 facing the wiring groove is made liquid affinity property with respect to the wiring functional liquid. The wiring functional liquid is thereby made to acclimate to the surface of the wettability variable layer 535 of the wiring groove and is filled so as to spread over the entire cross section of the wiring groove.

The wiring functional liquid is then solidified to form a film composed of the source line 516, the source electrode 517, and the drain electrode 514.

The effects of the fourth embodiment are described below. According to the fourth embodiment, the following effects can be obtained in addition to the effects of the first to third embodiments.

(1) Since the liquid-repellent layer 532 for forming the bank 504 in which the portion for forming the gate line 512 and the gate electrode 511 is formed as a wiring groove is liquid repellent, the upper surface of the bank 504 is liquid repellent. The wettability variable layer 531 facing the wiring groove has liquid repellency with respect to the wiring functional liquid containing the material that will form the wiring film. Since the wiring functional liquid is deposited in the wiring groove, it is very likely that the wiring functional liquid that has ridden up onto the bank 504 will be repelled by the liquid-repellent layer 532, which has liquid repellency, and flow down into the wiring groove, and the wiring functional liquid can be prevented from remaining on the bank 504.

The wiring functional liquid in the wiring groove is repelled by the wettability variable layer 531, which has liquid repellency, and has difficultly wetting and spreading to the edge of the bank 504. The possibility that the wiring functional liquid deposited in the wiring groove will ride up onto the top surface of the bank 504 is thereby made very low, and it is possible to make it very unlikely that the wiring functional liquid deposited in an adjacent wiring groove will pass over the bank 504 and be a connected.

(2) After the wiring functional liquid has been deposited in the wiring groove for forming the gate line 512 and the gate electrode 511, the wettability variable layer 531 is made liquid affinity property prior to solidification. The wettability variable layer 531 is made liquid affinity property, whereby the side surface of the wiring groove is more readily wetted by the wiring functional liquid. Therefore, the wiring functional liquid deposited in the wiring groove wets and spreads to the side surface of the wiring groove and is filled so as to spread over the entire cross section of the wiring groove. It is thereby possible to form the gate line 512 and the gate electrode 511 with substantially the same shape in which the cross-sectional shape is specified by the cross-sectional shape of the wiring groove.

Fifth Embodiment

Figure 21A:
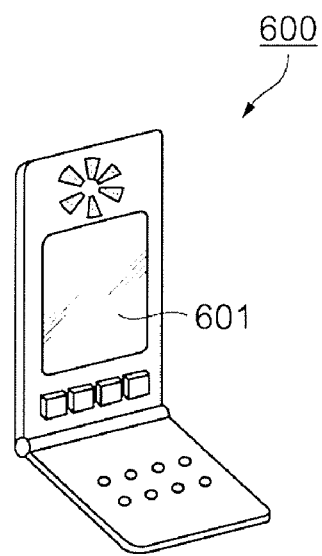
FIG. 21A is a perspective view of the external appearance of an example of a mobile phone as an example of an electro-optical device.
Figure 21B:
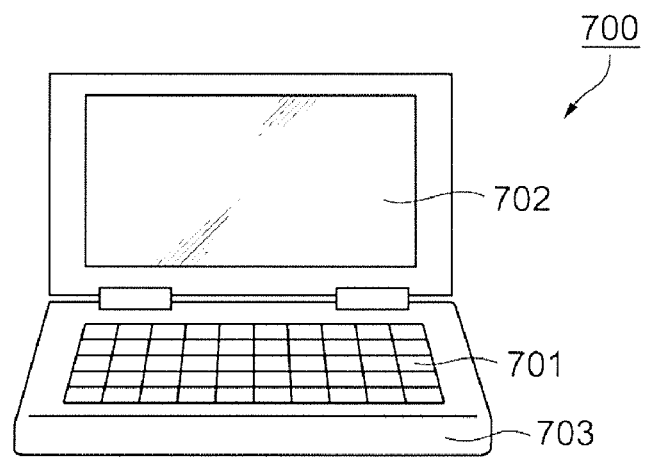
FIG. 21B is a perspective view of the external appearance of an example of a notebook computer or another mobile information-processing device.
Figure 21C:
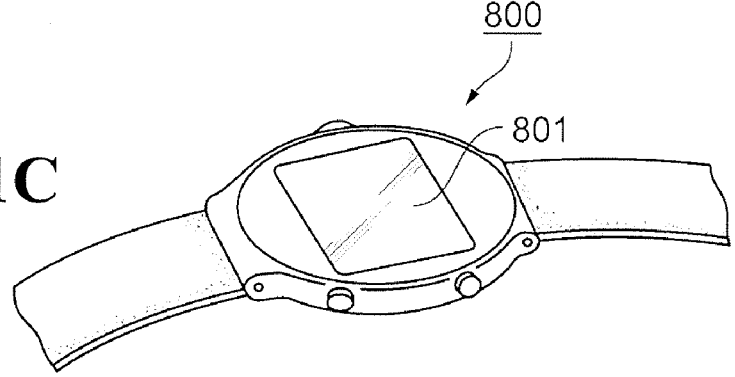
FIG. 21C is perspective view of the external appearance of an example of a wristwatch-type electro-optical device.

Described next with reference to the drawings is a fifth embodiment as an embodiment of the film-formation method, method for manufacturing an electro-optical device, electro-optical device, and electronic apparatus. The present embodiment describes an electronic apparatus provided with an electro-optical device. The electronic apparatus of the present embodiment is an electronic apparatus provided with the liquid crystal display device described in the third embodiment. A specific example of the electronic apparatus of the present embodiment will be described with reference to FIGS. 21A to 21C. FIGS. 21A to 21C are perspective views of the external appearance of electronic devices.

FIG. 21A is a perspective view of the external appearance of an example of a mobile phone as an example of an electro-optical device. The mobile phone 600 shown in FIG. 21A is provided with a liquid crystal device section 601 having the liquid crystal display panel 200 of the embodiments described above.

FIG. 21B is a perspective view of the external appearance of an example of a notebook computer or another mobile information-processing device. The information-processing device 700 shown in FIG. 21B is provided with a keyboard or another input section 701, an information-processing main unit 703, and a liquid crystal device section 702 provided with a liquid crystal display device such as the liquid crystal display panel 200 of the embodiments described above.

FIG. 21C is perspective view of the external appearance of an example of a wristwatch-type electro-optical device. The wristwatch-type electronic apparatus 800 shown in FIG. 21C is provided with a liquid crystal device section 801 having a liquid crystal display device such as the liquid crystal display panel 200 of the embodiments described above.

The electronic apparatuses of FIGS. 21A to 21C are provided with a liquid crystal display device such as the liquid crystal display panel 200 of the embodiments described above. The liquid crystal display device is provided with a color filter in which high performance can be obtained because of the use of filter films that have been formed using a film-formation method in which a film (filter film) having a sufficient thickness and cross-sectional shape that allows the designed functions of the film (filter film) to be demonstrated is formed by filling and spreading a functional liquid over the entire surface of a film formation area (filter film area).

According to the fifth embodiment, the following effects can be obtained.

(1) The mobile phone 600, the information-processing device 700, and the wristwatch-type electronic apparatus 800 are provided with the liquid crystal display panel 200 in which advantageous display function is achieved or a liquid crystal display panel in which the same advantageous display function is achieved, by forming the filter films 205 in a specified shape using the film-formation method in which the filter films 205 can be formed without gaps over the entire surface of the filter film region 225. Accordingly, the mobile phone 600, the information-processing device 700, and the wristwatch-type electronic apparatus 800 having advantageous display function can be achieved.

Preferred embodiments were described above with reference to the attached drawings, but the preferred embodiments are not limited to the embodiments described above. It is apparent that various modifications can be made in a range that does not depart from the spirit of the present invention, and the embodiments can be modified as described below.

Modified Example 1

In the embodiments described above, a CF layer 208 was described as a color filter provided to a liquid crystal display panel 200, but a color filter that can be advantageously manufactured using the film-formation method described above is not limited to a color filter of a liquid crystal display device. A color filter for an organic EL display device for forming a color organic EL display device can be advantageously manufactured in combination with a luminescent layer for emitting colored or colorless light by using the film-formation method described above.

Modified Example 2

In the second embodiment, a first wettability variable layer 324 and a second wettability variable layer 325 composed of a wettability-variable material were provided in order to form a hole-transport layer 316 and a luminescent layer 317, but it is not required that a plurality of layers composed of a wettability-variable material be provided in correspondence with the plurality of functional liquids to be formed. Configurations are also possible in which the side surface near the top section of the partition walls formed using a wettability-variable material in order to accommodate the formation of a functional liquid to be formed in the area near the top section of the partition walls, and in which the side surface near the bottom of the film formation region of the partition walls is made liquid affinity property in order to accommodate the formation of a functional liquid to be formed in the area near the bottom of the film formation region. The deposited functional liquid can be prevented from riding up on the partition walls by forming the side surface near the top section of the partition walls from a wettability-variable material and making the material to be liquid repellent when the functional liquid is deposited.

Modified Example 3

In the first to third embodiments, the partition walls 204 were provided with a black matrix 202 in addition to a wettability variable layer 31 and a liquid-repellent layer 32, and the partition walls 315 were provided with a light-blocking layer 323 in addition to a first wettability variable layer 324, a second wettability variable layer 325, and a liquid-repellent layer 326. However, the functional film may be one that transmits light or one that emits light, and it is not required that the partition walls be provided with a light-blocking layer in addition to the a wettability variable layer or a liquid-repellent layer. The wettability variable layer and the liquid-repellent layer may be formed using a material having light-blocking properties, or a light-blocking material may be added to the material constituting the wettability variable layer and the liquid-repellent layer to impart light-blocking properties.

Modified Example 4

In the first to third embodiments, the partition walls 204 were provided with a black matrix 202 as the lowest layer nearest the glass substrate 201, and the partition walls 315 were provided with a light-blocking layer 323 as the lowest layer nearest the glass substrate 310. However, it is not required that a light-blocking layer be provided to the lowest layer. The light-blocking layer may be provided as the layer for forming the top surface, for example. In this case, the light-blocking layer is preferably composed of a material having liquid repellency.

Modified Example 5

In the embodiments described above, the CF layer 208 of the liquid crystal display panel 200 had three color filters having three filter films, namely, a red filter film 205R, a green filter film 205G, and a blue filter film 205B, but the color filter may be a multicolored filter having many types of filter films. Examples of the multicolored filter include a color filter with six colors having, in addition to red, green, and blue, the organic EL elements cyan (blue green), magenta (purple red), yellow (yellow color) as complimentary colors of red, green, and blue; and a color filter with four colors in which green is included with cyan (blue green), magenta (purple red), and yellow (yellow color).

Modified Example 6

In the embodiments described above, drawing discharge was described for when the filter films 205, the hole-transport layer 316, and the luminescent layer 317 are formed in a liquid crystal display panel 200 or an organic EL display device 300 as an electro-optical device. However, the electro-optical device is not limited to a liquid crystal device or an organic EL device. The electro-optical device may be any electro-optical device as long as a film such as that described above must be formed in the formation process or a device having a film such as that described above.

Modified Example 7

In the embodiments described above, examples of a target object on which the functional film is formed using the film-formation method were described using a liquid crystal display panel 200 having filter films 205, an organic EL display device 300 having a luminescent layer 317, a TFT array substrate 510 of a liquid crystal display device having a gate line 512 and a source line 516, and other examples, as examples of an electro-optical device. However, the target object for forming the functional liquid using the film-formation method is not limited to an electro-optical device. The film-formation method described above may be used as a film-formation method for various target work objects on which a liquid is to be deposited to form a film during manufacture. For example, application can be made in a method for forming an electroconductive wiring film on a wiring substrate in which electroconductive material is deposited in a liquid form in order to manufacture a wiring substrate having wiring composed of electroconductive material; in a method for forming an electroconductive wiring film on a semiconductor wafer or a semiconductor device in which electroconductive material is deposited in a liquid form in order to form an electroconductive wiring film of a semiconductor wafer or a semiconductor device; in a method for forming an insulating film on a semiconductor wafer or a semiconductor device in which insulating material is deposited in a liquid form in order to form an insulating layer of a semiconductor wafer or a semiconductor device; as well as in other methods.

Modified Example 8

In the second embodiment described above, the organic EL elements 307 had a configuration in which the hole-transport layer 316 and the luminescent layer 317 were sandwiched between the pixel electrodes 314 and the opposing electrodes 318, but the organic EL elements are not limited to such a configuration. Known configurations of the organic EL elements include configurations in which only the luminescent layer is sandwiched between the pixel electrodes and the opposing electrodes; configurations in which the hole-transport layer, the luminescent layer, and the electron-transport layer are in a sandwiched configuration; configurations in which the hole-transport layer, the luminescent layer, the electron-transport layer, and the hole-injection layer are in a sandwiched configuration; and configurations in which the hole-transport layer, the luminescent layer, the electron-transport layer, the hole-injection layer, and the electron injection layer are in a sandwiched configuration. The film-formation method of the present invention may also be applied to the formation of the electron-transport layer, the hole-injection layer, and the electron injection layer.

Modified Example 9

In the second embodiment described above, a first wettability variable layer 324 and a second wettability variable layer 325 were provided, and the film-formation method described above was applied to form a hole-transport layer 316 and a luminescent layer 317 in the organic EL elements 307. However, it is not required that a device be formed by applying the film-formation method described above to the formation of all the functional films constituting a device having functional films. For example, the film-formation method described above may be applied to the formation of only the functional films that are very dramatically affected when the functional film extends beyond the film formation area, or in other cases in which application is made to only a portion of the functional films.

Modified Example 10

In the first to third embodiments described above, the planar shape of the filter film region 225, the pixel region 321, and the like was a quadrangular shape having corner sections, but it is not required that the shape of the filter film region, the pixel region, or other regions in which the functional film is to be formed be quadrangular. The shape may be a polygonal shape other than a quadrangular shape, or a shape composed of substantially circular shapes or other curves. In recent years, display devices have been considered in which the pixel shape is different from a quadrangular shape in order to improve display characteristics.

Modified Example 11

In the fifth embodiment described above, an electronic apparatus was described as an example having a display section provided with a liquid crystal display device such as the liquid crystal display panel 200, but it is not required that the liquid crystal display device of the electronic apparatus be a liquid crystal display device in which the CF layer is formed using the film-formation method described above. The liquid crystal display device of the electronic apparatus may be an electronic apparatus provided with a liquid crystal display device or the like in which the wiring film is formed using the film-formation method described above, such as the TFT array substrate 510 described in the fourth embodiment.

Modified Example 12

In the fifth embodiment described above, an electronic apparatus was described as an example having a display section provided with a liquid crystal display device such as the liquid crystal display panel 200, but it is not required that the electro-optical device of the electronic apparatus be a liquid crystal display device. The electro-optical device of the electronic apparatus may be an electronic apparatus provided with another electro-optical device in which the wiring film is formed using the film-formation method described above, an example of which is the organic EL display device 300 described in the second embodiment.

Modified Example 13

In the embodiments described above, the droplet discharge head 17 was an inkjet-type droplet discharge head, but the droplet discharge head is not required to be an inkjet-type droplet discharge head. The discharge head used for depositing the liquid may be a droplet discharge head of a method other than the inkjet method.

Modified Example 14

In the embodiments described above, a droplet discharge device for discharging the functional liquid as droplets using the inkjet method was described as a deposition device, but the deposition device is not limited to a droplet discharge device that uses the inkjet method. For example, the device may be one in which liquid is deposited using another method such as a liquid processing device having a plurality of micro dispensers.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A film-formation method for depositing a liquid containing a film material to form a film in a prescribed film formation area enclosed by a partition wall on a substrate, the film-formation method comprising:
    forming the partition wall using at least in part a wettability-variable material in which wettability with respect to the liquid is variable;
    depositing the liquid in the film formation area;
    varying the wettability of the wettability-variable material in the partition wall in a state in which the liquid is disposed within the film formation area so that liquid affinity of the wettability-variable material becomes higher than liquid affinity of the wettability-variable material before the liquid is deposited in the film formation area; and
    forming the film by solidifying the film material in the liquid.

2. The film-formation method according to claim 1, wherein
    the forming of the partition wall includes forming at least a portion of an upper surface of the partition wall using a material having liquid-repelling properties with respect to the liquid.

3. The film-formation method according to claim 1, wherein
    the forming of the partition wall includes layering one or more partition wall layers including a partition wall layer composed of the wettability-variable material to form the partition wall.

4. The film-formation method according to claim 3, wherein
    the forming of the partition wall further includes
        forming a first partition wall layer composed of a first wettability-variable material, and
        forming a second partition wall layer on the first partition wall layer, the second partition wall layer being composed of a second wettability-variable material in which wettability is variable by a method different from a method of varying wettability of the first wettability-variable material.

5. The film-formation method according to claim 1, wherein
    the forming of the partition wall further includes
        forming a first partition wall film,
        removing a portion of the first partition wall film to form an enlarged partitioned area having a size that includes the film formation area,
        forming a second partition wall film composed of the wettability-variable material in the enlarged partitioned area, and
        removing a portion of the second partition wall film to form the film formation area.

6. The film-formation method according to claim 1, wherein
    the varying of the wettability of the wettability-variable material includes varying the wettability by applying heat to the wettability-variable material.

7. The film-formation method according to claim 1, wherein the varying of the wettability of the wettability-variable material includes varying the wettability by irradiating the wettability-variable material with light.

8. The film-formation method according claim 1, wherein the forming of the film includes solidifying the film material by applying heat to the liquid.

9. The film-formation method according to claim 1, wherein
the forming of the film includes solidifying the film material by irradiating the liquid with light.

10. A method for manufacturing an electro-optical device comprising:

forming a functional film constituting an electro-conductive device using the film-formation method according to claim 1.

11. The film-formation method according to claim 1, wherein
the depositing of the liquid in the film formation area includes depositing the liquid so that a height of the film formed by solidifying the film material in the liquid will be smaller than a height of the partition wall.

* * * * *